US 9,551,767 B2

United States Patent
Sabate et al.

(10) Patent No.: US 9,551,767 B2
(45) Date of Patent: Jan. 24, 2017

(54) SYSTEM AND METHOD TO REDUCE POWER LOSS IN A GRADIENT AMPLIFIER

(71) Applicant: General Electric Company, Schenectady, NY (US)

(72) Inventors: Juan Antonio Sabate, Gansevoort, NY (US); Wesley Michael Skeffington, Clifton Park, NY (US); Song Chi, Clifton Park, NY (US); Rixin Lai, Clifton Park, NY (US); Yimeng Shi, Hangzhou (CN); Yanjun Zhang, Shanghai (CN)

(73) Assignee: General Electric Company, Schenectady, NY (US)

( * ) Notice: Subject to any disclaimer, the term of this patent is extended or adjusted under 35 U.S.C. 154(b) by 1010 days.

(21) Appl. No.: 13/709,812

(22) Filed: Dec. 10, 2012

(65) Prior Publication Data
US 2013/0162250 A1 Jun. 27, 2013

(30) Foreign Application Priority Data
Dec. 21, 2011 (CN) .......................... 2011 0 431233

(51) Int. Cl.
*G01V 3/00* (2006.01)
*G01R 33/36* (2006.01)
(Continued)

(52) U.S. Cl.
CPC ....... *G01R 33/3614* (2013.01); *G01R 33/3852* (2013.01); *G01R 33/543* (2013.01)

(58) Field of Classification Search
CPC .................................................. G01R 33/3852
(Continued)

(56) References Cited

U.S. PATENT DOCUMENTS 5,021,784 A 6/1991 Groeneveld
5,038,263 A 8/1991 Marrero
(Continued)

FOREIGN PATENT DOCUMENTS

CN 1136370 A 11/1996
CN 1247319 A 3/2000
(Continued)

OTHER PUBLICATIONS

Sabate, et al; High-Power High-Fidelity Switching Amplifier Driving Gradient Coils for MRI Systems; Power Electronics Specialists Conference, 2004 IEEE 35th Annual; Jun. 20-25, 2004.
(Continued)

*Primary Examiner* — Louis Arana
(74) *Attorney, Agent, or Firm* — GE Global Patent Operation; Marc A. Vivenzio

(57) ABSTRACT

A gradient amplifier system, includes: a power stage comprising a plurality of bridge amplifiers, each operates at a first switching frequency; a gradient coil coupled to the power stage and configured to produce a magnetic field proportional to a coil current signal supplied by the power stage; a controller stage coupled to an input terminal of the power stage and configured to: generate a pulse width modulated gate signal based on the coil current signal and a reference current signal, wherein the pulse width modulated gate signal is generated at a second switching frequency when a slew rate associated with the reference current signal is below a threshold rate for at least a first time period; and apply the pulse width modulated gate signal to the power stage for changing an operating frequency of each of the plurality of bridge amplifiers from the first to the second switching frequency.

37 Claims, 11 Drawing Sheets

(51) Int. Cl.
*G01R 33/54* (2006.01)
*G01R 33/385* (2006.01)

(58) Field of Classification Search
USPC .................................................. 324/322, 318
See application file for complete search history.

(56) References Cited

U.S. PATENT DOCUMENTS

| | | | |
|---|---|---|---|
| 5,513,094 | A | 4/1996 | Stanley |
| 6,031,746 | A | 2/2000 | Steigerwald et al. |
| 6,353,354 | B1* | 3/2002 | Detweiler ................ H02J 1/10 327/110 |
| 6,437,999 | B1 | 8/2002 | Wittenbreder |
| 6,777,907 | B2 | 8/2004 | Ho |
| 6,777,939 | B2 | 8/2004 | Bechtold et al. |
| 6,930,483 | B2 | 8/2005 | Sabate |
| 7,016,205 | B2 | 3/2006 | Steigerwald |
| 7,142,440 | B2 | 11/2006 | de Rooj |
| 7,397,248 | B2 | 7/2008 | Lenz |
| 7,468,607 | B2 | 12/2008 | Lenz |
| 7,511,563 | B2 | 3/2009 | Botker |
| 7,821,799 | B2 | 10/2010 | Jacobs |
| 7,832,385 | B1 | 11/2010 | Kapinski |
| 7,880,577 | B1 | 2/2011 | Glaser |
| 8,294,465 | B2 | 10/2012 | Gudino et al. |
| 8,502,539 | B2* | 8/2013 | Lai ..................... G01R 33/3852 324/309 |
| 2003/0090232 | A1 | 5/2003 | Ho |
| 2004/0075435 | A1 | 4/2004 | Weyers et al. |
| 2004/0223348 | A1 | 11/2004 | West |
| 2005/0024056 | A1 | 2/2005 | Sabate |
| 2005/0073863 | A1 | 4/2005 | de Rooj |
| 2005/0073865 | A1 | 4/2005 | Steigerwald |
| 2005/0275404 | A1 | 12/2005 | Sabate et al. |
| 2007/0090693 | A1 | 4/2007 | Fox |
| 2008/0101099 | A1 | 5/2008 | Jacobs |
| 2009/0051415 | A1 | 2/2009 | Botker |
| 2009/0201704 | A1 | 8/2009 | Sickels |
| 2009/0231890 | A1 | 9/2009 | Schutten |
| 2010/0141174 | A1 | 6/2010 | Negrete |
| 2011/0074413 | A1 | 3/2011 | Venkatesa |
| 2012/0049908 | A1* | 3/2012 | Karlsson ............... H02M 3/157 327/154 |
| 2012/0249145 | A1* | 10/2012 | Lai ..................... G01R 33/3852 324/318 |
| 2015/0177345 | A1* | 6/2015 | Ham .................. G01R 33/3852 324/309 |
| 2015/0372605 | A1* | 12/2015 | Karlsson ............. H02M 3/3376 363/21.06 |

FOREIGN PATENT DOCUMENTS

| | | |
|---|---|---|
| CN | 1441259 A | 9/2003 |
| CN | 1745315 A | 3/2006 |
| CN | 1883111 A | 12/2006 |
| CN | 1969196 A | 5/2007 |
| CN | 102208900 A | 10/2011 |
| EP | 1444773 A1 | 11/2002 |
| EP | 1671412 A1 | 6/2004 |
| EP | 1595159 A1 | 11/2005 |
| EP | 2101399 A1 | 9/2009 |
| WO | 03041260 A1 | 5/2003 |
| WO | 2005034319 A1 | 4/2005 |
| WO | 2009029165 A1 | 3/2009 |
| WO | 2009102382 A1 | 8/2009 |
| WO | 2010068640 A1 | 6/2010 |

OTHER PUBLICATIONS

Office Action issued in connection with corresponding CN Application No. 201110431233.3 on Sep. 28, 2014.

* cited by examiner

SYSTEM AND METHOD TO REDUCE POWER LOSS IN A GRADIENT AMPLIFIER

BACKGROUND OF THE INVENTION

The disclosure relates generally to magnetic resonance imaging (MRI) systems and more specifically to reducing power losses in a gradient amplifier system adapted for use in MRI systems.

In just a few decades, the use of magnetic resonance imaging (MRI) scanners has grown tremendously. MRI scans are being increasingly used to aid in the diagnosis of multiple sclerosis, brain tumors, torn ligaments, tendonitis, cancer, strokes, and the like. As will be appreciated, MRI is a noninvasive medical test that aids physicians in the diagnoses and treatment of various medical conditions. The enhanced contrast that an MRI scan provides between the different soft tissues of the body allows physicians to better evaluate the various parts of the body and determine the presence of certain diseases that may not be assessed adequately with other individual imaging methods such as X-ray, ultrasound, or computed tomography (CT).

A conventional MRI system typically establishes a homogenous magnetic field generally along a central axis of a subject undergoing an MRI procedure. This homogeneous magnetic field affects the gyro magnetic material of the subject for imaging by aligning the nuclear spins in atoms and molecules forming the body tissue. For example, in medical applications, the nuclear spins are aligned along the direction of the magnetic field. If the orientation of the nuclear spins is perturbed out of alignment with the magnetic field, the nuclei attempt to realign their spins with the field. Perturbation of the orientation of nuclear spins is typically caused by application of radio frequency (RF) pulses tuned to the Larmor frequency of the material of interest. During the realignment process, the nuclei precess about their axes and emit electromagnetic signals that may be detected by one or more RF detector coils placed on or about the subject.

The frequency of the magnetic resonance (MR) signal emitted by a given precessing nucleus depends on the strength of the magnetic field at the location of the nucleus. It is possible to distinguish signals originating from different locations within the subject using encoding, typically phase and frequency encoding, created by gradient coils that apply gradient fields over the main magnetic field. A typical MRI system includes three gradient coils for providing respective fields along the X, Y, and Z axes. Control of the gradient coils allows for orientation of the axes for encoding of locations within the subject, and for selection of a desired "slice" for imaging.

Furthermore, these gradient coils typically produce additional magnetic fields that are superimposed on the primary magnetic field to permit localization of the image slices and also provide phase encoding and frequency encoding. This encoding permits identification of the origin of resonance signals during image reconstruction. The image quality and resolution depends significantly on how the applied fields can be controlled. To achieve faster imaging rates, the gradient fields are typically modified at frequencies of several kHz. Control of the gradient coils is generally performed in accordance with pre-established protocols or sequences, called pulse sequence descriptions, permitting many types of tissues to be imaged and distinguished from other tissues in a medical context, or for imaging various features of interest in other applications.

Typically, a gradient coil operates at high current levels and high voltage ranges. Therefore, it is desirable to provide a gradient amplifier that is configured to supply the gradient coils with the desired current and voltage levels. In certain embodiments, the gradient amplifier is a power amplifier.

Earlier implementations of gradient amplifiers used linear amplifiers that provided high fidelity. However, given present power level requirements, the use of these amplifiers becomes impractical due to need for the higher voltages and currents. Present day techniques use hybrid systems that combine linear amplifiers with switching power stages. Such systems use bridges in parallel or bridges stacked to meet the system requirements, and typically employ power semiconductor devices. However, in the conventional gradient amplifier system, each of the bridges has different direct current (DC) link voltages and different voltage commands, which unfortunately results in different switching frequencies for each of the bridges. Since each of the bridges operates at different switching frequencies with different DC link voltages, there is significant power loss in the gradient amplifier system. Moreover, the power loss increases when a low voltage is desired across the gradient coil. In addition, the power losses are unevenly distributed across the bridges, and the loading on each bridge is also different, causing intense thermal stress on the gradient amplifiers.

It is therefore desirable to develop a design of a gradient amplifier system that reduces power loss. Particularly, it is desirable to develop the design of a controller stage and a power stage architecture in the gradient amplifier system that provides high power and delivers high fidelity with reduced power loss and cost through circuit topologies and control mechanisms.

BRIEF DESCRIPTION OF THE INVENTION

Briefly in accordance with an aspect of the technique, a gradient amplifier system is presented. The gradient amplifier system includes a power stage that includes a plurality of bridge amplifiers, where each of the plurality of bridge amplifiers operates at a first switching frequency. The gradient amplifier system further includes a gradient coil coupled to the power stage and configured to produce a magnetic field proportional to a coil current signal supplied by the power stage. In addition, the gradient amplifier system includes a controller stage coupled to an input terminal of the power stage and configured to generate a pulse width modulated gate signal based on the coil current signal and a reference current signal, where the pulse width modulated gate signal is generated at a second switching frequency upon occurrence of a slew rate associated with the reference current signal is below a determined threshold rate for at least a first time period. Further, the controller stage is configured to apply the generated pulse width modulated gate signal to the power stage for changing an operating frequency of each of the plurality of bridge amplifiers from the first switching frequency to the second switching frequency.

In accordance with a further aspect of the present technique, a method for controlling a gradient amplifier system is presented. The method includes receiving a coil current signal from a power stage that includes a plurality of bridge amplifiers operating at a first switching frequency. Also, the method includes receiving a reference current signal for controlling a magnetic field across a gradient coil. The method further includes generating a pulse width modulated gate signal based on the coil current signal and the reference current signal, where the pulse width modulated gate signal is generated at a second switching frequency when a slew rate associated with the reference current signal is below a determined threshold rate for at least a first time period. The method also includes applying the pulse width modulated gate signal to the power stage for changing an operating frequency of each of the plurality of bridge amplifiers from the first switching frequency to the second switching frequency.

In accordance with another aspect of the present technique, a controller stage for controlling a gradient amplifier system is presented. The controller stage includes a command generator configured to generate a voltage command signal based on a coil current signal and a reference current signal. In addition, the controller stage includes an analyzer configured to determine that a slew rate associated with the reference current signal is below a determined threshold rate for at least a first time period. The controller stage also includes a pulse width modulator coupled to the command generator and the analyzer and configured to modulate the voltage command signal based on the slew rate associated with the reference current signal.

In accordance with yet another aspect of the present technique, a system for magnetic resonance imaging is presented. The system includes a scanner control circuitry configured to acquire image data. The scanner control circuitry further includes a gradient coil configured to produce magnetic fields for localizing the imaging data. The scanner control circuitry also includes a gradient amplifier system coupled to the gradient coil and configured to supply a coil current signal to the gradient coil. Further, the gradient amplifier system includes a power stage including a plurality of bridge amplifiers, where each of the plurality of bridge amplifiers operates at a first switching frequency. The gradient amplifier also includes a controller stage coupled to an input terminal of the power stage and configured to generate a pulse width modulated gate signal based on the coil current signal and a reference current signal, where the pulse width modulated gate signal is generated at a second switching frequency when a slew rate associated with the reference current signal is below a determined threshold rate for at least a first time period. Further, the controller stage is configured to apply the generated pulse width modulated gate signal to the power stage for changing an operating frequency of each of the plurality of bridge amplifiers from the first switching frequency to the second switching frequency. The system also includes system control circuitry in operative association with the scanner control circuitry and configured to process the acquired image data.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

As will be described in detail hereinafter, various embodiments of an exemplary gradient amplifier system for use in magnetic resonance imaging (MRI) systems and methods for controlling the gradient amplifier system are presented. By employing the methods and the gradient amplifier system described hereinafter, power loss and thermal stress may be substantially reduced in the MRI systems.

Figure 1:
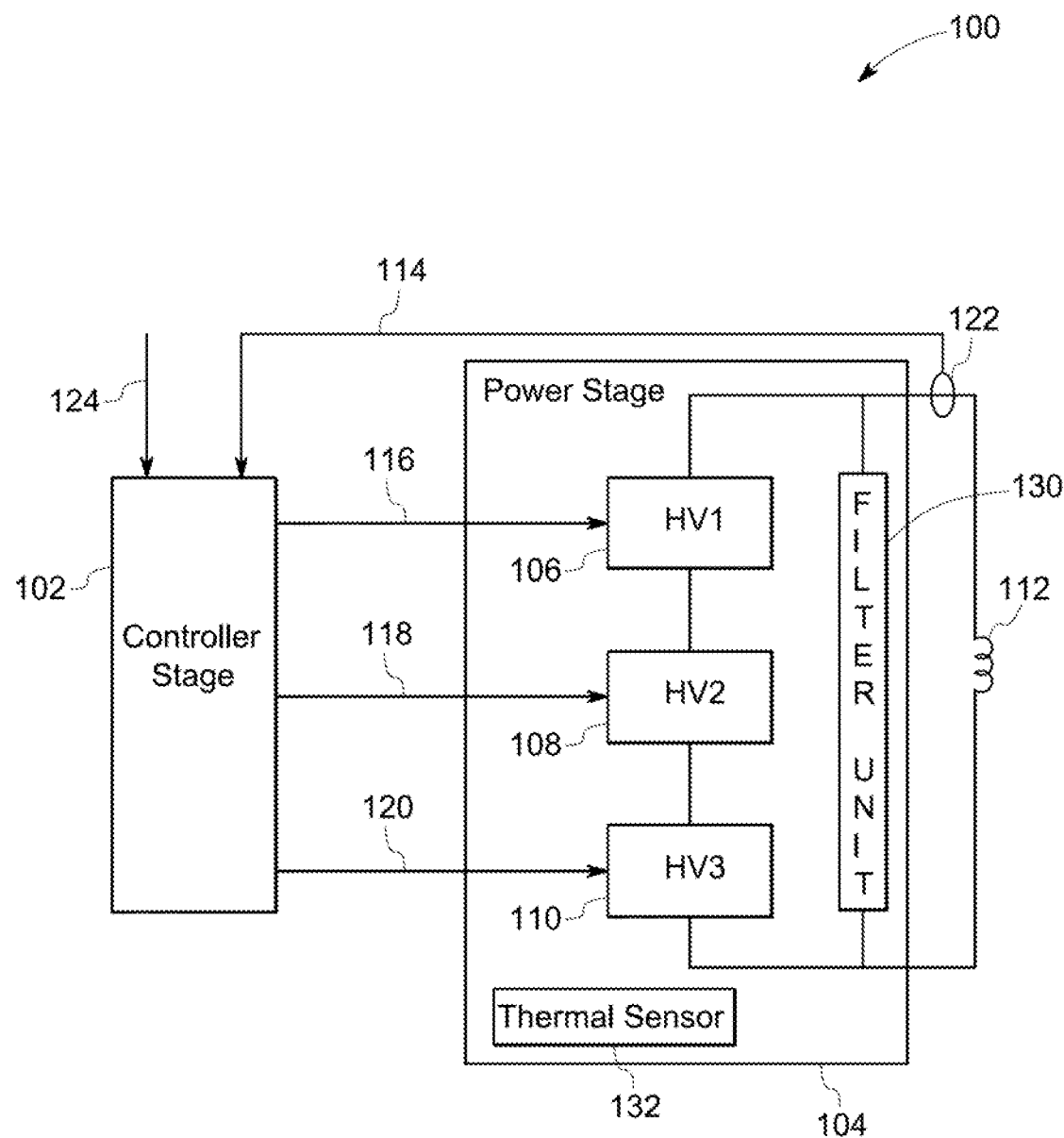
FIG. 1 is a diagrammatical illustration of a gradient amplifier system, in accordance with aspects of the present technique.

Turning now to the drawings, and referring to FIG. 1, a diagrammatical illustration of an exemplary gradient amplifier system 100 for use in an MRI system, in accordance with aspects of the present technique, is depicted. The gradient amplifier system 100 is illustrated diagrammatically as including a controller stage 102, a power stage 104, and a gradient coil 112. The functioning of each component will be described in greater detail with reference to FIGS. 1-14. As used herein, the term "power stage" is used to refer to a power amplifier for generating a current that in an example has a value in a range from about 0 amperes to about 500 amperes and a voltage having a value in a range from about 0 volts to about 2000 volts to drive the gradient coil 112 at a desired range. In an embodiment, the power stage 104 may generate a current having a value that is greater than 500 amperes and a voltage having a value that is greater than 2000 volts. Similarly, the term "controller stage" is used to refer to a controller/processor that is configured to control or regulate an amplitude level and a frequency of a voltage signal provided to the gradient coil 112.

As will be appreciated, an MRI system typically includes one or more gradient coils, such as the gradient coil 112, where each gradient coil 112 is driven by a corresponding power stage 104. The gradient coils 112 are typically used to alter a primary magnetic field of the MRI system by creating gradient fields at frequencies such as up to several kilohertz to facilitate fast imaging. Typical inductance levels in the gradient coil 112, in an example, may be in a range from about hundreds of µH to about 1 mH. Also, typical voltage levels in the gradient coil 112, in an example, may be in a range from about 1000 volts to about 2000 volts, while the current levels in the gradient coil 112 may be in a range from about 0 amperes to about 500 amperes. While the embodiments described hereinafter refer to MRI system applications, use of the present techniques in other applications that entail use of high voltage and high current at very high fidelity is also envisaged.

In a presently contemplated configuration, the gradient coil 112 is coupled to an output terminal of the power stage 104. In addition, the gradient coil 112 is configured to produce a magnetic field proportional to a coil current signal 114 received from the power stage 104. As used herein, the term "coil current signal" is used to refer to a current that is obtained at the output of the filter unit 130. In accordance with aspects of the present technique, a filter unit 130 may be disposed between the power stage 104 and the gradient coil 112. Particularly, in an embodiment, the filter unit 130 may be coupled to an output terminal of the power stage 104 to minimize a ripple current associated with the coil current signal 114 that is supplied by the power stage 104. Upon minimizing the ripple current, the filter unit 130 provides the filtered coil current signal 114 to the gradient coil 112. The aspect of filtering the coil current signal 114 at the filter unit 130 will be described in greater detail with reference to FIG. 13.

Figure 4:
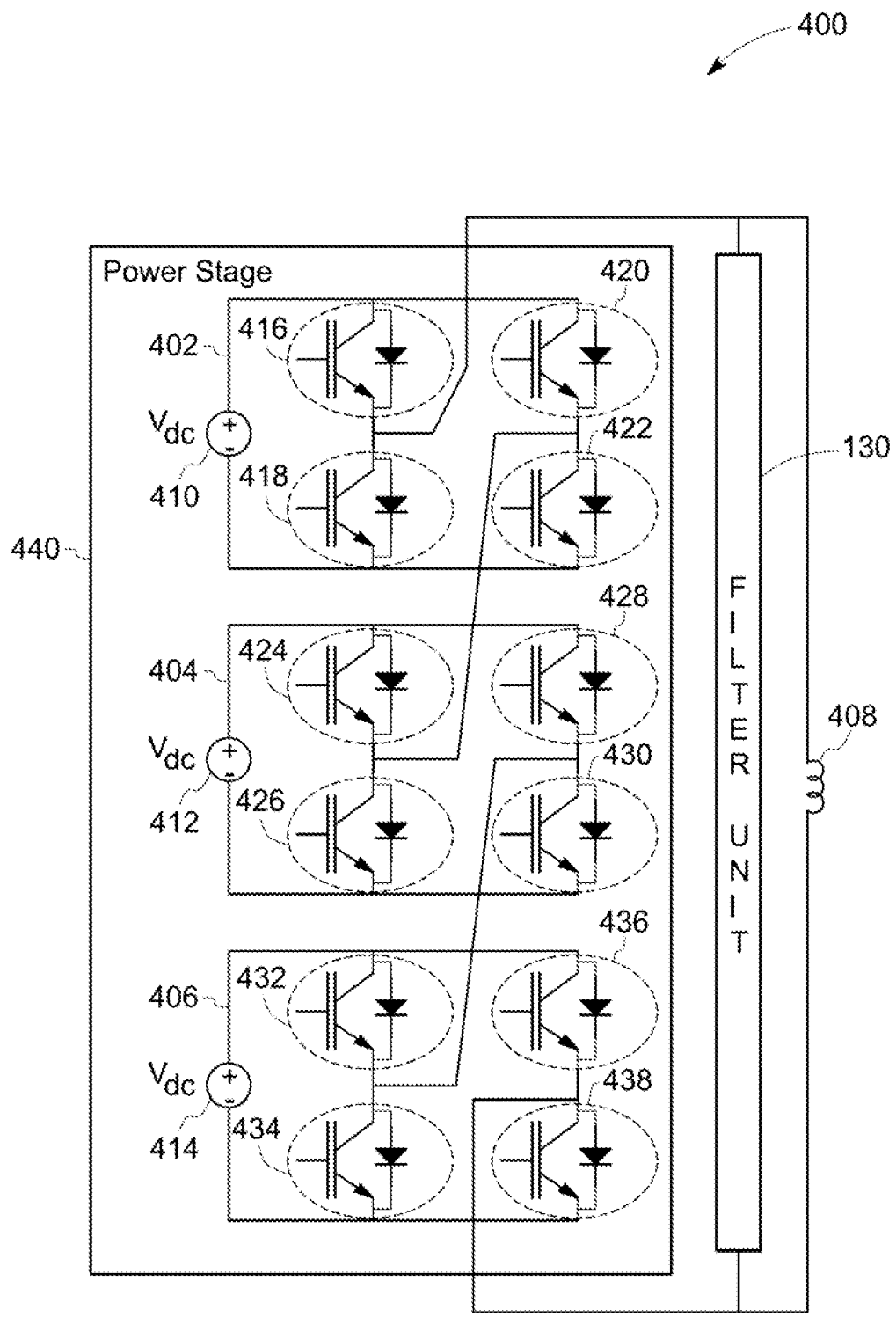
FIG. 4 is a schematic representation of the power stage of FIG. 2, in accordance with aspects of the present technique.

Further, the power stage 104 includes a plurality of bridge amplifiers. Particularly, in a presently contemplated configuration, the power stage 104 includes a first bridge amplifier 106, a second bridge amplifier 108, and a third bridge amplifier 110 that are coupled in series with each other. Although the present embodiment of the power stage 104 is described with reference to the three bridge amplifiers 106, 108, 110, it may be noted that the power stage 104 may include other numbers of bridge amplifiers in the power stage 104. Moreover, in an embodiment, each bridge amplifier may be a full bridge amplifier with a left leg and a right leg as depicted in FIG. 4. Additionally, each bridge amplifier may include a direct-current (DC) voltage source and a transistor module (not shown), and will be described in greater detail with reference to FIG. 4. Furthermore, the power stage 104 may include a thermal sensor 132. The thermal sensor 132 may be employed to determine a thermal value of the power stage 104. The thermal value may be representative of a temperature or heat in the power stage 104. The determined thermal value of the power stage 104 may be provided to the controller stage 102. In an embodiment, the thermal sensor 132 may instead be disposed in the controller stage 102 and configured to determine the thermal value of the power stage 104.

Moreover, an input terminal of the power stage 104 in the depicted example of FIG. 1 is coupled to an output terminal of the controller stage 102. The controller stage 102 controls the operation of the power stage 104 by communicating necessary control signals to the power stage 104. Particularly, the controller stage 102 transmits pulse width modulated gate signals 116, 118, 120 to the power stage 104 for controlling an operating frequency of each of the bridge amplifiers 106, 108, 110. As used herein, the term "operating frequency" is used to refer to a frequency that is employed for switching the bridge amplifiers between the ON and OFF states. In an embodiment, a single switching operating frequency may be used. By appropriately switching the bridge amplifiers 106, 108, 110 between the ON and OFF states, various intermediate and combined voltages are achieved at the output of the power stage 104. According to an embodiment, under certain conditions such as change in thermal, slew rate, and/or amplitude values, the frequency of the pulse width modulation can be changed by the controller stage 102 in order to regulate the system performance.

In the embodiment illustrated in FIG. 1, the controller stage 102 receives as inputs, a reference current signal 124 and the coil current signal 114. Particularly, the reference current signal 124 may be received from an external source, such as a host computer (not shown in FIG. 1). The reference current signal 124 is employed to generate the pulse width modulated gate signal. Thereafter, the generated pulse width modulated gate signal is used to control the gradient magnetic field across the gradient coil 112. Specifically, in an embodiment, the gradient magnetic field is controlled based on a slew rate and an amplitude level associated with the reference current signal 124. The term "slew rate" is used to refer to a rate at which the amplitude of the reference current signal 124 is varied with respect to time. In an embodiment, the gradient magnetic field is controlled based on a thermal value of the power stage 104.

Additionally, the coil current signal 114 is provided as a feedback signal from the output terminal of the power stage 104 to the controller stage 102 to facilitate stable operation of the gradient amplifier system 100. Specifically, the feedback signal (coil current signal) 114 is employed to stabilize the power delivered to the gradient coil 112. To that end, in an embodiment, a current sensor 122 is disposed at a node that connects the output terminal of the filter unit 130 to the gradient coil 112. The current sensor 122 senses the coil current signal 114 and communicates the sensed coil current signal 114 to the controller stage 102 as the feedback signal.

Figure 2:
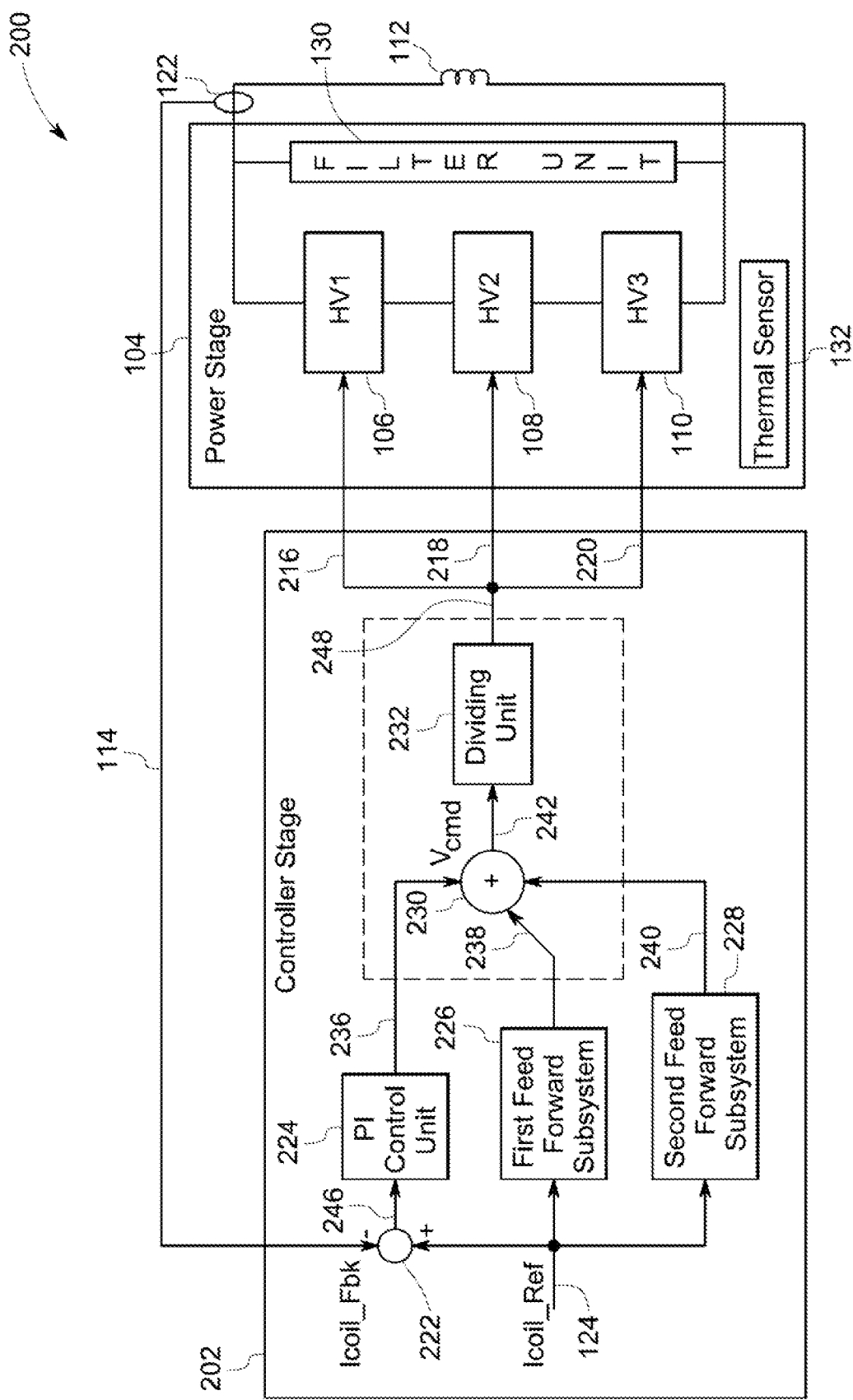
FIG. 2 is a diagrammatical illustration of an exemplary controller stage and a power stage of the gradient amplifier system of FIG. 1, in accordance with aspects of the present technique.

FIG. 2 is a diagrammatical representation of an embodiment 200 of the exemplary gradient amplifier system 100 of FIG. 1. Particularly, the gradient amplifier system 200 includes a controller stage 202 and a power stage such as the power stage 104 of FIG. 1.

In an embodiment, the controller stage 202 includes a comparator 222 that is coupled to an input terminal of a proportional integral (PI) control unit 224. The comparator 222 identifies an error current signal 246 by comparing the feedback coil current signal 114 with the reference current signal 124. The error current signal 246 may be indicative of a deviation of the coil current signal 114 from the reference current signal 124. It is desirable to reduce the deviation of the coil current signal 114 to maintain the stability or stable operation of the gradient amplifier system 200. The error current signal 246 so generated is provided to an input terminal of the PI control unit 224. Furthermore, the PI control unit 224 generates a PI voltage 236 corresponding to the error current signal 246. In addition, the PI control unit 224 may also aid in progressively minimizing the error current signal 246, thereby enhancing the transient response of the system 200.

In accordance with aspects of the present technique, the controller stage 202 further includes a first feed forward subsystem 226. The first feed forward subsystem 226 determines an inductance voltage drop 238 across the gradient coil 112. The controller stage 202 also includes a second feed forward subsystem 228. The second feed forward subsystem 228 determines a resistive voltage drop 240 across the gradient coil 112. In an embodiment, the combination of the first feed forward subsystem 226 and the second feed forward subsystem 228 may be represented as a coil model unit. This coil model unit may be employed in the controller stage 202 to determine the inductive and resistive voltage drops 238, 240 across the gradient coil 112.

Additionally, in an embodiment, the controller stage 202 includes a summing unit 230 that sums the PI voltage 236, the inductive voltage 238, and the resistive voltage 240 received at an input terminal, and provides a voltage command signal $V_{cmd}$ 242 at an output terminal of the summing unit 230. Further, the voltage command signal $V_{cmd}$ 242 is provided to a dividing unit 232 that divides the voltage command signal $V_{cmd}$ 242 based on a number of bridge amplifiers in the power stage 104. For example, if the power stage 104 includes three bridge amplifiers, such as the bridge amplifiers 106, 108, 110 then the voltage command signal $V_{cmd}$ 242 is divided into three equal parts. Accordingly, one third of the voltage command signal $V_{cmd}$ 242 is applied to each of the bridge amplifiers 106, 108, 110 in the power stage 104.

Furthermore, in accordance with aspects of the present technique, one unit of the divided voltage command signal $V_{cmd}$ 242 is modulated according to a pulse width modulation scheme to generate a pulse width modulated gate signal 248. The pulse width modulated gate signal 248 is generated at a frequency based on a slew rate and/or an amplitude level of the reference current signal 124 and the thermal value of the power stage 104. Particularly, in an embodiment, the pulse width modulated gate signal 248 may be generated at a first switching frequency if the slew rate of the reference current signal 124 is above a determined threshold rate. In some instances, the slew rate of the reference current signal 124 may drop below the determined threshold rate, but the amplitude level of the reference current signal 124 may continue to be below a determined level. In these instances, the pulse width modulated gate signal 248 is generated at the first switching frequency even though the slew rate of the reference current signal 124 is below the determined threshold rate.

In a similar manner, the pulse width modulated gate signal 248 may be generated at a second switching frequency if the slew rate associated with the reference current signal 124 is below the determined threshold rate. Particularly, if the slew rate of the reference current signal 124 is below the determined threshold rate for at least a first time period, then the pulse width modulated gate signal 248 is generated at the second switching frequency.

In an embodiment, the pulse width modulated gate signal 248 may also be generated at the second switching frequency if the thermal value of the power stage 104 is above a determined thermal value. In some instances, the slew rate of the reference signal 124 may be above the threshold rate, but the thermal value of the power stage 104 may also be above the threshold thermal value. In these instances, the pulse width modulated gate signal 248 is generated at the second switching frequency to prevent overheating of the power stage 104. In another embodiment, the pulse width modulated gate signal 248 may be generated at the second switching frequency if the slew rate of the reference signal 124 is below the threshold rate for at least the first time period and the amplitude level of the reference current signal 124 is above the determined level. The second switching frequency is maintained at a value less than a value of the first switching frequency to reduce power loss and thermal stress in the system 200. In accordance with an embodiment, a control logic module (not shown in FIG. 2) having pre-programmed instructions/codes may be employed to generate the pulse width modulated gate signal 248 according to a pulse width modulation scheme.

With continuing reference to FIG. 2, the generated pulse width modulated gate signal 248 is then separately applied to each bridge amplifier, via their corresponding paths 216, 218, 220. The pulse width modulated gate signal 248 is employed to control an operating frequency of each of the bridge amplifiers 106, 108, 110. In accordance with exemplary aspects of the present technique, since a substantially similar pulse width modulated gate signal 248 is applied to each bridge amplifier, each of the bridge amplifiers 106, 108, 110 operates at a substantially similar frequency at any instant of time. By way of example, initially if the bridge amplifiers 106, 108, 110 are operating at a higher first switching frequency and a pulse width modulated gate signal having a lower second switching frequency is applied to the power stage 104, the operating frequency of each of the bridge amplifiers 106, 108, 110 changes from the higher first switching frequency to the lower second switching frequency. This change in switching frequency aids in significantly reducing the conduction loss and switching loss in the system 200.

In addition to operating the bridge amplifiers at substantially similar switching frequencies, the DC voltage sources (see FIG. 4) coupled to the bridge amplifiers are also configured to supply a substantially similar DC voltage to a corresponding bridge amplifier. This supply of substantially similar voltages to the bridge amplifiers results in an even distribution of power loss in the system 200. Also, since substantially similar bridge amplifiers and DC voltage sources are employed, design and manufacturing constraints are substantially reduced. Consequently, cost of designing and manufacturing the system 200 is also significantly reduced.

As previously noted, with reference to FIG. 1, the filter unit 130 is coupled to the output terminal of the power stage 104 to minimize a ripple current associated with the coil current signal 114 that is supplied by the power stage 104. Upon minimizing the ripple current, the filter unit 130 provides the filtered coil current signal to the gradient coil 112.

Figure 3:
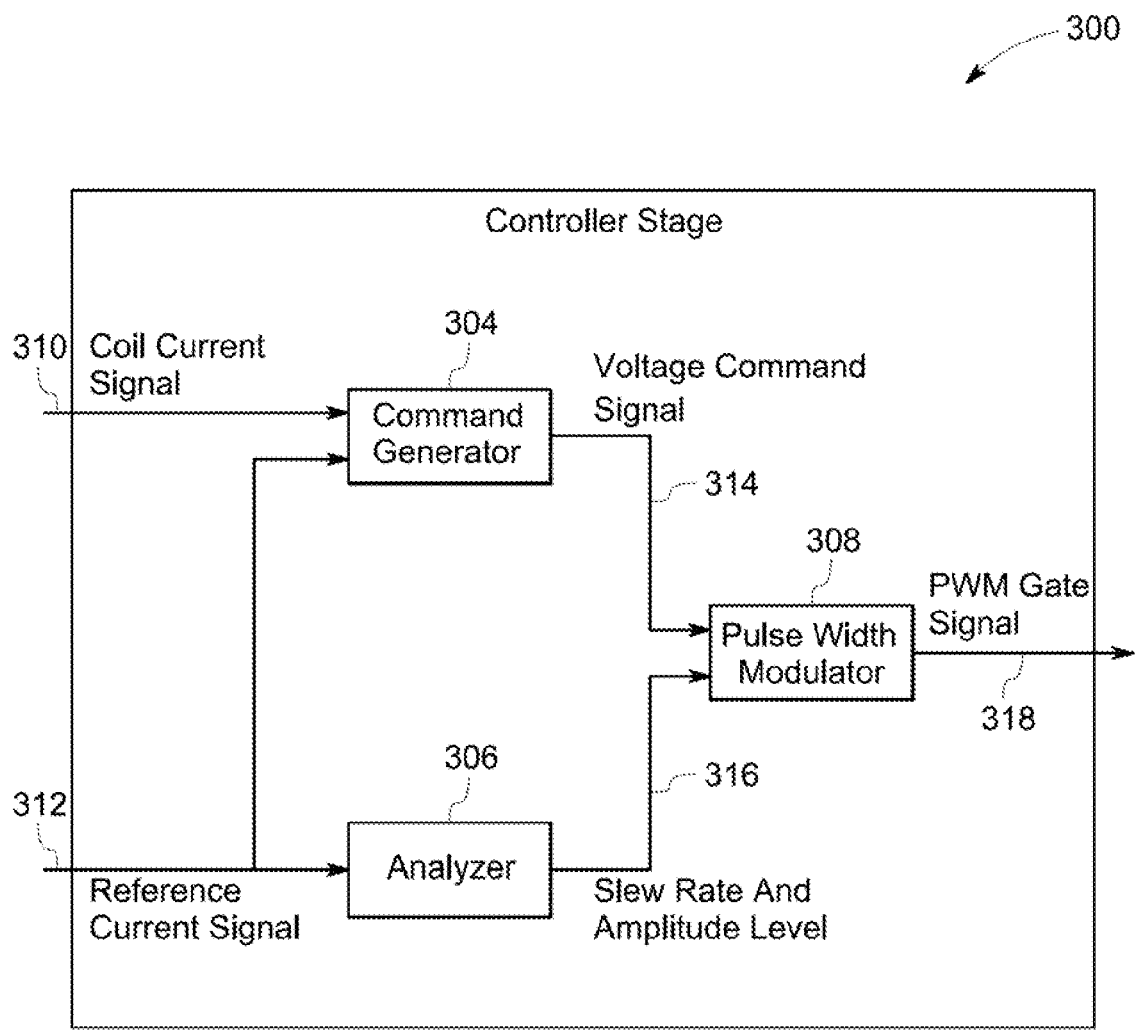
FIG. 3 is a block diagram representation of the controller stage of FIG. 2, in accordance with aspects of the present technique.

Referring now to FIG. 3, a block diagram representation 300 of an embodiment of the controller stage 202 of FIG. 2 is depicted. In a presently contemplated configuration, the controller stage 300 includes a command generator 304, an analyzer 306, and a pulse width modulator 308. The command generator 304, in an embodiment, may include a combination of subunits such as the comparator unit 222, the PI control unit 224, the first feed forward subsystem 226, the second feed forward subsystem 228, and the summing unit 230 of FIG. 2.

In accordance with aspects of the present technique, the command generator 304 receives a coil current signal 310 and a reference current signal 312 at an input terminal. Furthermore, the command generator 304 generates a voltage command signal 314 at an output terminal. Particularly, the command generator 304 generates the voltage command signal 314 based on the received coil current signal 310 and the reference current signal 312. In accordance with another embodiment, the command generator 304 may include a processor (not shown in FIG. 3) that stores instructions to aid in the generation of the voltage command signal 314 based on the coil current signal 310 and the reference current signal 312. Moreover, the generated voltage command signal 314 may be supplied to the pulse width modulator 308. The pulse width modulator 308 is configured to modulate the voltage command signal 314 according to a determined pulse width modulation scheme.

The analyzer 306 receives the reference current signal 312 and determines a slew rate and an amplitude level associated with the reference current signal 312. In accordance with another embodiment, the analyzer 306 may include a processor (not shown in FIG. 3) that stores instructions to aid in determining the slew rate and the amplitude level information 316 associated with the reference current signal 312. Furthermore, in certain embodiments, the slew rate and the amplitude level information 316 of the reference current signal 312 may be determined concurrently with the generation of the voltage command signal 314. Alternatively, the slew rate and the amplitude level information 316 of the reference current signal 312 may also be determined before or after the generation of the voltage command signal 314. Also, this slew rate and the amplitude level information 316 is communicated to the pulse width modulator 308. In addition, the voltage command signal 314 is also provided as an input to the pulse width modulator 308.

Furthermore, the pulse width modulator 308 generates a pulse width modulated gate signal 318. In particular, the pulse width modulator 308 is configured to generate the pulse width modulated gate signal 318 at a frequency that is based on the slew rate and the amplitude level information 316 of the reference current signal 312. Specifically, the pulse width modulated gate signal 318 may be generated at a first switching frequency if the slew rate of the reference current signal 312 is above a determined threshold rate. In addition, the pulse width modulated signal 318 may also be generated at the first switching frequency if the slew rate of the reference signal is below the threshold rate and the amplitude level of the reference current signal 312 is below a determined level. In an embodiment, the pulse width modulated signal 318 may be generated at the first switching frequency if the slew rate associated with the reference signal 312 is above the determined threshold rate and the thermal value associated with the power stage 104 is below a threshold thermal value. In another embodiment, the pulse width modulated signal 318 may be generated at the first switching frequency if the pulse width modulator 308 determines that the slew rate associated with the reference current signal 312 rises above the determined threshold rate within a second time period. The second time period may be in a range from about 0 to 200 μs.

Alternatively, the pulse width modulated gate signal 318 may be generated at a second switching frequency if the slew rate of the reference current signal 312 is below the threshold rate for at least a first time period. Particularly, if the slew rate of the reference current signal 312 is below the determined threshold rate for at least the first time period, then the pulse width modulated gate signal 318 is generated at the second switching frequency. In an embodiment, the pulse width modulated gate signal 318 may be generated at the second switching frequency if the thermal value of the power stage 104 is above a determined thermal value. In some instances, the slew rate of the reference signal 312 may be above the threshold rate, but the thermal value of the power stage 104 may also be above a threshold thermal value. In these instances, the pulse width modulated gate signal 312 is generated at the second switching frequency to prevent overheating of the power stage 104. In another embodiment, the pulse width modulated gate signal 318 may be generated at the second switching frequency if the slew rate of the reference current signal 312 is below the threshold rate for at least the first time period and the amplitude level of the reference current signal 312 is above the determined level. It may be noted that in certain embodiments, the second switching frequency is less than the first switching frequency so as to reduce power loss and thermal stress in the gradient amplifier system 200 (see FIG. 2). For example, when a low voltage is desired across a gradient coil, such as the gradient coil 112 (see FIG. 2), the operating frequency of each bridge amplifier, such as the bridge amplifiers 106, 108, 110 (see FIG. 2), is changed from the higher first switching frequency to the lower second switching frequency. This change in operating frequency of each of the bridge amplifiers facilitates significant reduction in switching losses and conduction losses in the gradient amplifier system 200.

FIG. 4 is a schematic representation of an embodiment 400 of a power stage 440, such as the power stage 104 (see FIG. 1) configured to drive a gradient coil 408, such as the gradient coil 112 (see FIG. 1), in accordance with aspects of the present technique. In a presently contemplated configuration, the power stage 440 includes three bridge amplifiers 402, 404, 406 that are coupled in series. In an embodiment, these bridge amplifiers 402, 404, 406 may be representative of the bridge amplifiers 102, 104, 106 of FIG. 1. The bridge amplifiers 402, 404, 406 are further coupled in series with the gradient coil 408. Moreover, in an embodiment, the bridge amplifiers 402, 404, 406 have substantially similar topologies. A first DC voltage source 410 is coupled across the first bridge amplifier 402, a second DC voltage source 412 is coupled across the second bridge amplifier 404, and a third DC voltage source 414 is coupled across the third bridge amplifier 406. Each of the DC voltage sources 410, 412, 414 is configured to supply a substantially similar DC voltage across the corresponding bridge amplifier. By way of example, if it is desirable to supply a DC voltage of about 800 volts, then each of the DC voltage sources 410, 412, 414 supplies a DC voltage of about 800 volts to the corresponding bridge amplifier.

In accordance with further aspects of the present technique, the first bridge amplifier 402 includes transistor modules 416, 418, 420, 422, in an embodiment. These transistor modules may be of any suitable type of solid state switching device, such as insulated gate bipolar junction transistors (IGBTs), metal oxide semiconductor field effect transistors (MOSFETs), and the like. Particularly, the transistor modules 416 and 418 are connected to each other to form a first leg or left leg of the first bridge amplifier 402. Similarly, transistor modules 420 and 422 are connected to each other to form a second leg or right leg of the bridge amplifier 402. The first and second legs of the first bridge amplifier 402 are connected in parallel. It may be noted that either one of the legs may be configured to operate as an input terminal while the other leg may be configured to operate as an output terminal of the first bridge amplifier 402. Also, it may be noted that the meet point of any two transistor modules may be an input or output terminal. In a similar manner, the second bridge amplifier 404 includes a first leg or left leg having transistor modules 424 and 426 and a second leg or right leg having transistor modules 428 and 430. Further, the third bridge amplifier 406 includes a first leg or left leg having transistor modules 432 and 434 and a second leg or right leg having transistor modules 436 and 438.

Figure 5:
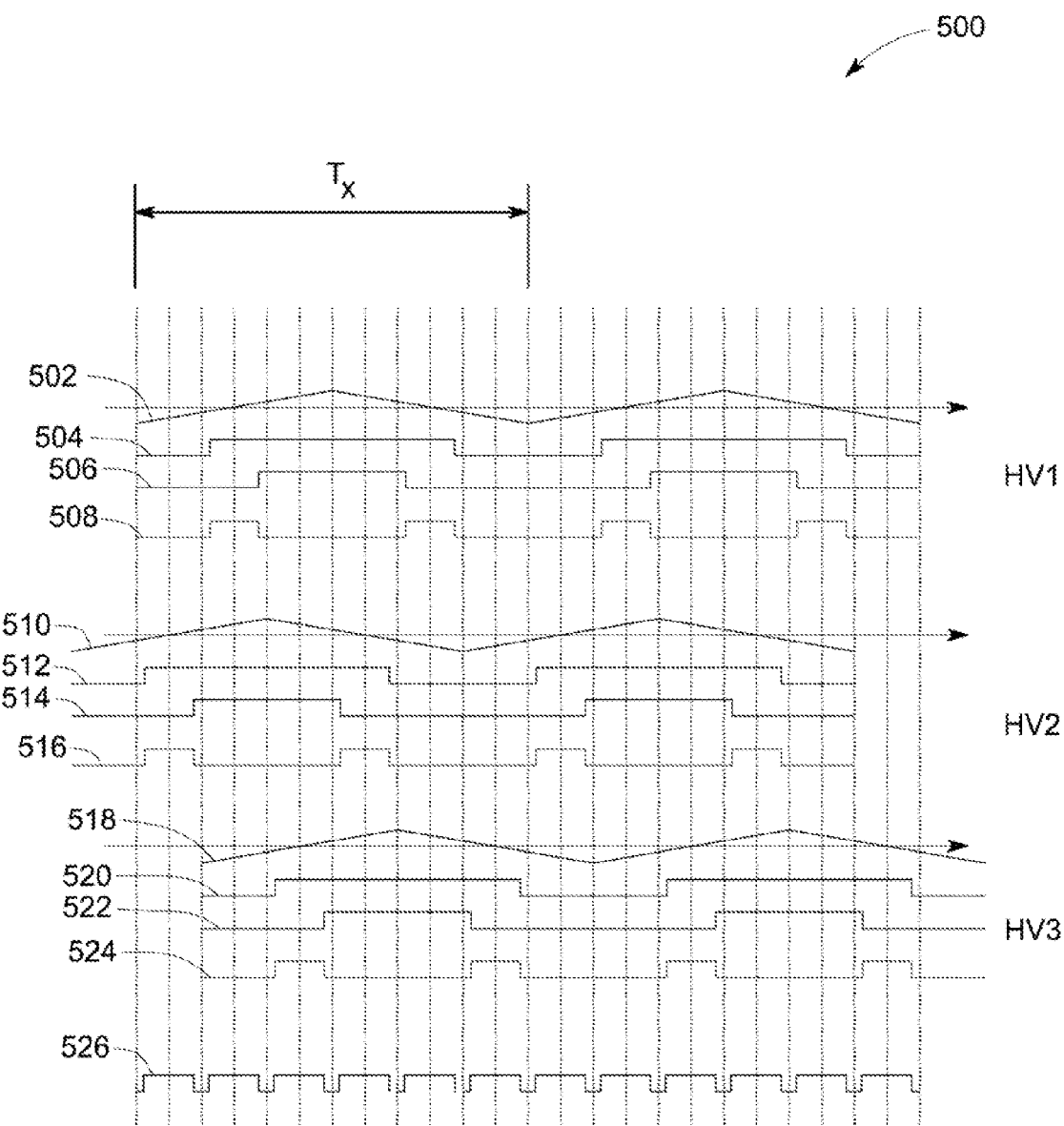
FIG. 5 is a graphical representation of an output voltage of the power stage of FIG. 4, in accordance with aspects of the present technique.

Further, the transistor modules in each of the bridge amplifiers 402, 404, 406 are configured to be switched ON or OFF based on the pulse width modulated gate signal provided by the controller stage, as depicted in FIG. 2. By way of example, in the first bridge amplifier 402, a pulse width modulated gate signal is applied to a base terminal of the transistors modules 416, 418, 420, and 422 during a time period $T_x$ (see FIG. 5). Particularly, during a part of the time period $T_x$ a pulse width modulated (PWM) gate signal, such as a PWM gate signal 504 of FIG. 5, is applied to the transistor modules 416, 418, where the transistor module 416 is turned to ON state, while the transistor module 418 is turned to OFF state. Similarly, during the other part of the time period $T_x$, the pulse width modulated gate signal, such as a PWM gate signal 506 of FIG. 5, is applied to the transistor modules 420, 422, where the transistor module 420 is turned to ON state, while the transistor module 422 is turned to OFF state. Since the transistor modules of the first bridge amplifier 402 switches ON and OFF during a respective time period/duty cycle, the output voltage, such as the voltage 508 (see FIG. 5), of the first bridge amplifier 402 is a modulated output voltage signal.

In addition, since each bridge amplifier includes at least two legs and each leg is conducting during a respective time period/duty cycle, the frequency of the modulated output voltage signal at each bridge amplifier is at least twice the frequency of the applied pulse width modulated gate signal. Consequently, the frequency of the total output voltage signal at the output of the power stage 440 is a product of the frequency of the pulse width modulated gate signal and at least twice the number of bridge amplifiers in the power stage 440. By way of example, in the embodiment depicted in FIG. 4, the power stage 440 includes three bridge amplifiers. Accordingly, the frequency of the total output voltage signal at the output of the power stage 440 is a product of the frequency of pulse width modulated gate signal and twice the number of bridge amplifiers, which in the present example is six. For ease of understanding, the frequency of the output voltage signal is graphically represented in FIGS. 5 and 6.

Moreover, since the bridge amplifiers 402, 404, 406 are connected in series, the total output voltage of the power stage 440 is a sum of the DC voltages supplied by each of the DC voltage sources 410, 412, 414. By way of example, if it is desirable for each DC voltage source to supply a DC voltage of about 800 volts to a corresponding bridge amplifier, the total output voltage of the power stage 440 may swing from about −2400 volts to about +2400 volts across the power stage 440. Since all the bridge amplifiers 402, 404, 406 are configured to use substantially similar transistor modules that operate at substantially similar DC voltages, design and manufacture costs of the gradient amplifier system 100 (see FIG. 1) may be significantly reduced without compromising the performance of the system 100.

Turning now to FIG. 5, a graphical representation 500 of an output voltage of a power stage, such as the power stage 440 (see FIG. 4), in accordance with aspects of the present technique, is illustrated. In particular, FIG. 5 graphically illustrates a relationship between a carrier signal and output voltages across the three bridge amplifiers 402 (HV1), 404 (HV2), 406 (HV3) of FIG. 4. Plot 502 represents the carrier waveform/signal that is employed in a pulse width modulation scheme for generating the pulse width modulated gate signal. Furthermore, plot 504 is representative of the pulse width modulated gate signal applied to the left leg of the first bridge amplifier 402. Similarly, plot 506 represents the pulse width modulated gate signal that is applied to the right leg of the first bridge amplifier 402. Moreover, plot 508 is indicative of an output voltage of the first bridge amplifier 402. The output voltage of the first bridge amplifier 402 is a modulated output voltage, as depicted by plot 508. Particularly, the pulse width modulated gate signal is applied to the left leg and the right leg of the first bridge amplifier 402 so as to obtain the modulated output voltage 508 at the output terminal of the first bridge amplifier 402.

In a similar manner, plots 510 and 518 respectively represent the carrier waveforms/signals corresponding to the second and third bridge amplifiers 404 (HV2) and 406 (HV3). Further, plots 512 and 520 respectively represent the pulse width modulated gate signals applied to the left legs of the second and third bridge amplifiers 404 and 406. Plots 514 and 522 respectively represent the pulse width modulated gate signals applied to the right legs of the second and third bridge amplifiers 404 and 406. Moreover, plots 516 and 524 respectively represent output voltages across the second and third bridge amplifiers 404, 406. Additionally, since the bridge amplifiers 402, 404, 406 are connected in series, the total output voltage of the power stage 440 (see FIG. 4), represented by plot 526, is obtained by adding individual output voltages across each of the bridge amplifiers 402, 404, 406 that are represented by plots 508, 516, 524. In accordance with aspects of the present technique, the pulse width modulated gate signals are applied to the bridge amplifiers 402, 404, 406 in such a way that only one bridge amplifier in the power stage generates an output voltage at a given instance of time. The timing of the pulse width modulated gate signal to each bridge amplifier is controlled by control logic implemented in a controller stage such as the controller stage 202 (see FIG. 2).

In addition, as previously noted with reference to FIG. 4, each bridge amplifier includes at least two legs. Further, in a time period $T_x$, each leg in the bridge amplifiers conducts based on a corresponding pulse width modulated gate signal. Since both the legs in each bridge amplifier are conducting in the time period $T_x$, the frequency at the output of each bridge amplifier is twice the frequency of the pulse width modulated gate signal. Thus, the frequency of the total output voltage at the output of the power stage is a multiple of the frequency of the pulse width modulated gate signal and at least twice the number of bridge amplifiers 402, 404, 406 included in the power stage, as depicted in plot 526. By way of example, if the frequency of the pulse width modulated is $f_{pwm}$ and three bridge amplifiers are employed in the power stage, the frequency $f_{total}$ of the total output voltage signal may be represented as:

$$f_{total} = 6 * f_{pwm} \quad (1)$$

Figure 6:
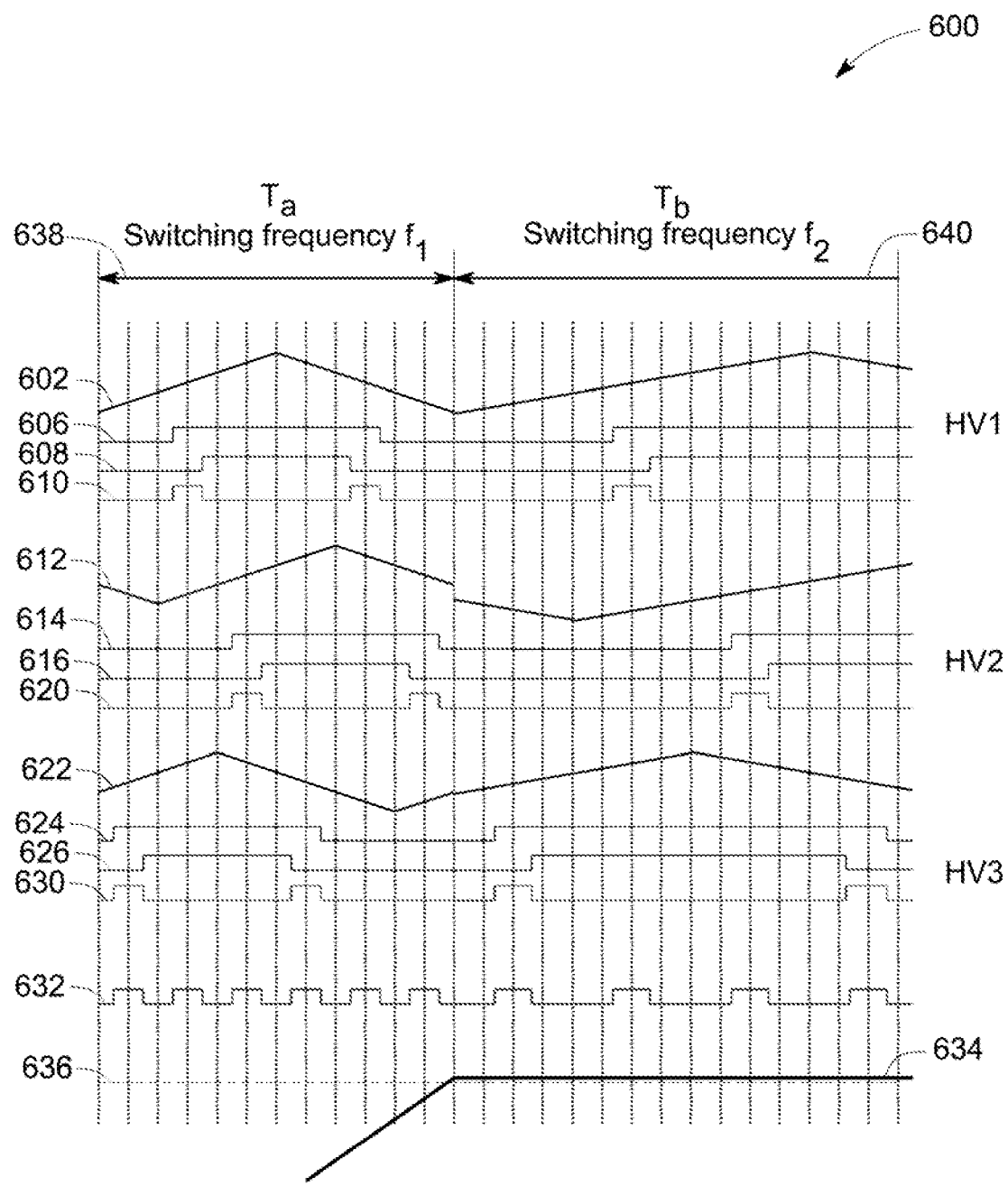
FIG. 6 is a graphical representation of an output voltage of the power stage of FIG. 4 under different switching frequencies and a varying reference current signal, in accordance with aspects of the present technique.

FIG. 6 is a graphical representation 600 of an output voltage of a power stage, such as the power stage 440 (see FIG. 4) at different switching frequencies and a varying reference current signal, in accordance with aspects of the present technique. Plots 602, 612, 622 are representative of carrier waveforms/signals with different time delays. Further, plot 606 represents a pulse width modulated gate signal applied to a left leg of the first bridge amplifier 402 (see FIG. 4), while plot 608 represents the pulse width modulated gate signal applied to a right leg of the first bridge amplifier 402. In accordance with exemplary aspects of the present technique, the pulse width modulated gate signals are applied to each leg of the first bridge amplifier 402 at different time periods such that the output voltage across the first bridge amplifier 402 is obtained only when one of the two pulse width modulated gate signals 606, 608 is in a high state or ON state. The output voltage across the first bridge amplifier 402 is generally represented by plot 610.

Further, plots 614 and 624 respectively represent the pulse width modulated gate signals applied to the left legs of the second and third bridge amplifiers 404 and 406. Also, plots 616 and 626 respectively represent the pulse width modulated gate signals applied to the right legs of the second and third bridge amplifiers 404 and 406. Furthermore, plots 620 and 630 respectively represent output voltages across the second and third bridge amplifiers 404 and 406. As previously noted with reference to FIG. 5, since the bridge amplifiers are connected in series, the total output voltage 632 of the power stage is obtained by adding individual output voltages 610, 620, 630 across each of the bridge amplifiers 402, 404, and 406.

With continuing reference to FIG. 6, during the time period $T_a$ 638, the amplitude level of a reference current signal 634 is below a determined level 636, and the slew rate is also below a determined threshold rate. Thus, during the time period $T_a$, each of the bridge amplifiers 402, 404, 406 may operate at a first switching frequency $f_1$. In an embodiment, irrespective of the amplitude level of the reference current signal 634, each of the bridge amplifiers 402, 404, 406 may also operate at the first switching frequency $f_1$ if the slew rate of the reference current signal 634 is above the determined threshold rate.

Also, as depicted in FIG. 6, during a time period $T_b$ 640, the reference current signal 634 reaches a flat top portion. It may be noted that for a duration of this flat top portion of the reference current signal 634, the slew rate of the reference current signal 634 is below the determined threshold rate and the amplitude level of the reference current signal 634 is above or equal to the determined level 636. Thus, during this time period $T_b$ 640, the pulse width modulated gate signal switches the operating frequency of each of the bridge amplifiers 402, 404, 406 from the first switching frequency $f_1$ to the second switching frequency $f_2$. This change in the operating frequency of each of the bridge amplifiers from the first switching frequency $f_1$ to the second switching frequency $f_2$ substantially reduces the power loss in the gradient amplifier system such as the gradient amplifier system 100 (see FIG. 1). Particularly, the power loss is reduced during the time period $T_b$ 640 as a low voltage is required across the gradient coil to produce a desired magnetic field.

Figure 7:
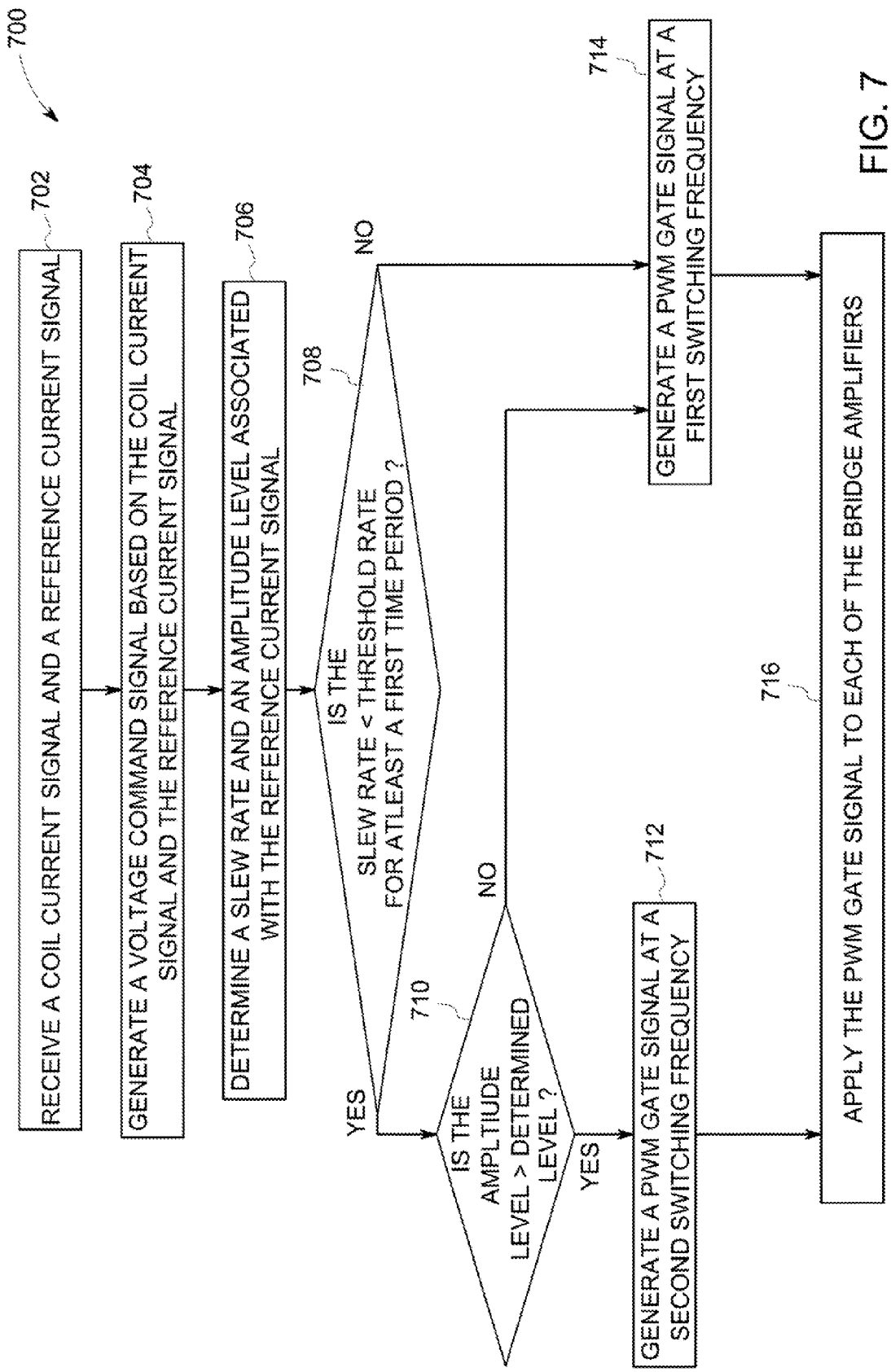
FIG. 7 is a flow chart illustrating a method for controlling the gradient amplifier system, in accordance with aspects of the present technique.

Referring now to FIG. 7, a flow chart 700 illustrating a method for controlling a gradient amplifier system, such as the gradient amplifier system 100 of FIG. 1, in accordance with aspects of the present technique, is depicted. For ease of understanding of the present technique, the method is described with reference to the components of FIG. 3. The method begins at a step 702, where a coil current signal such as the coil current signal 310 (see FIG. 3) and a reference current signal such as the reference current signal 312 (see FIG. 3) are received by the gradient amplifier system. Particularly, the command generator 304 (see FIG. 3) in the controller stage 300 receives the reference current signal 312 and the coil current signal 310. The coil current signal 310 is received as a feedback current signal from a node connecting an output terminal of a power stage to a gradient coil (see FIG. 2). Further, as previously noted, the reference current signal 312 may be received from an external source and is employed to control the magnetic field across the gradient coil 312 (see FIG. 2).

Subsequently, at step 704, the command generator 304 generates a voltage command signal 314 based on the received coil current signal 310 and the reference current signal 312. Furthermore at step 706, the analyzer 306 in the controller stage 300 receives the reference current signal 312 and determines a slew rate and an amplitude level associated with the reference current signal 312. The slew rate and the amplitude level of the reference current signal 312 may change randomly depending upon the voltage or magnetic field desired across the gradient coil 112. Also, as previously noted, the slew rate and the amplitude level of the reference current signal 312 may be determined concurrently with the generation of the pulse width modulated gate signal. Alternatively, the slew rate and the amplitude level of the reference current signal 312 may also be determined before or after the generation of the voltage command signal 314.

Also, at step 708, the pulse width modulator 308 verifies whether the slew rate is below a determined threshold rate. Particularly, at step 708 if it is determined that the slew rate of the reference current signal 312 is below the determined threshold rate for at least a first time period, a further check is carried out to verify whether the amplitude level of the reference current signal 312 is greater than a determined level, as indicated by step 710. At step 710, if it is determined that the amplitude level of the reference current signal 312 is greater than the determined level, a pulse width modulated gate signal 318 at a second switching frequency is generated, as depicted by step 712. In an embodiment, at step 712, the pulse width modulated signal 318 may also be generated at the second frequency if the thermal value of the power stage 104 is above a threshold thermal value even though the slew rate of the reference signal is above the threshold rate and the amplitude level of the reference signal is above or below the determined level. However, at step 710, if it is determined that the amplitude level of the reference current signal 312 is less than the determined level, a pulse width modulated gate signal at a first switching frequency is generated, as indicated by step 714.

With returning reference to step 708, if it is determined that the slew rate of the reference current signal 312 is greater than the determined threshold rate, the pulse width modulated gate signal is generated at the first switching frequency, as depicted by step 714. In an embodiment, at step 714, the pulse width modulated signal 318 may also be generated at the first frequency if the slew rate associated with the reference signal 312 is above the determined threshold rate and the thermal value is below the threshold thermal value. In another embodiment, at step 708, if it is determined that the slew rate associated with the reference current signal rises above the determined threshold rate within a second time period, then the pulse width modulated gate signal 318 is generated at the first switching frequency, as depicted by step 714. Consequent to the generation of the pulse width modulated gate signal either at the first switching frequency (step 714) or the second switching frequency (step 712), the controller stage 300 applies the pulse width modulated gate signal to each of the bridge amplifiers, as depicted by step 716. Also, in certain embodiments, the pulse width modulator 308 in the controller stage 300 may be configured to perform the steps 708-716.

Based on the slew rate and the amplitude level of the reference current signal 312, and the thermal value of the power stage 104, the applied pulse width modulated gate signal may change the operating frequency of each of the bridge amplifiers. By changing the operating frequency according to the slew rate and the amplitude level of the reference current signal 312 and the thermal value of the power stage 104, power loss and thermal stress in the gradient amplifier system may be substantially reduced.

Figure 8:
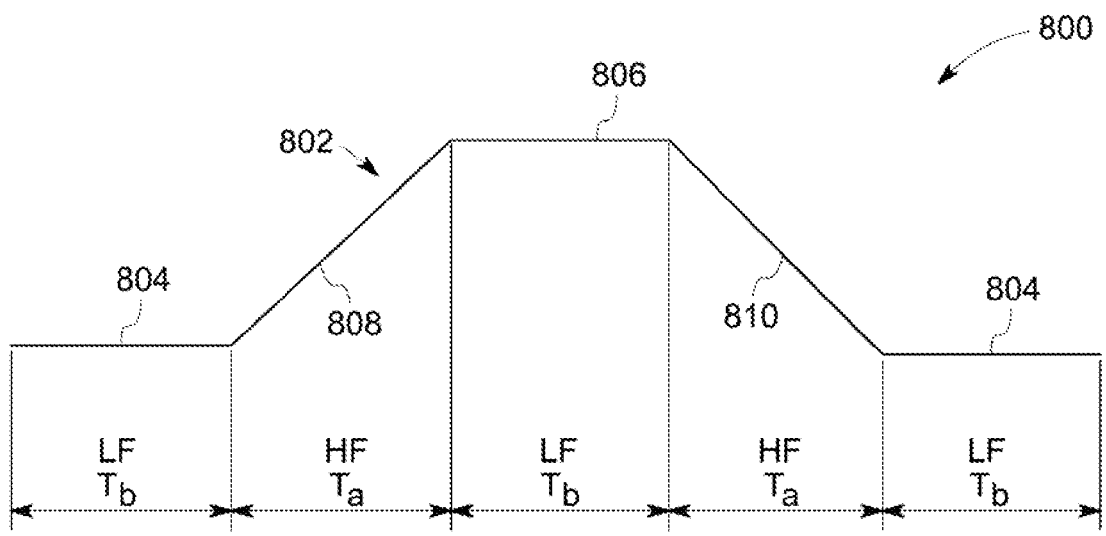
FIG. 8 is a graphical representation of a reference current signal, in accordance with aspects of the present technique.

FIG. 8 is a graphical representation 800 of a reference current signal, such as the reference current signal 312 (see FIG. 3) employed to generate a pulse width modulated signal, such as the pulse width modulated signal 318 (see FIG. 3), in accordance with aspects of the present technique. For ease of understanding of the present technique, FIG. 8 is described with reference to the components of FIG. 3. Plot 802 represents the reference current signal that is applied to the analyzer 306 (see FIG. 3). The reference current signal, in plot 802, shows flat bottom portions 804 and a flat top portion 806 during a time period $T_b$, where a slew rate of the reference current signal is below a determined threshold rate. Similarly, the reference current signal 802 shows a ramp-up portion 808 and a ramp-down portion 810 during a time period $T_a$, where the slew rate of the reference current signal 312 is above the determined threshold rate.

In accordance with an exemplary embodiment, the analyzer 306 determines the slew rate information of the reference current signal 312 depicted by plot 802. Further, the determined slew rate information is sent to the pulse width modulator 308 (see FIG. 3). The pulse width modulator 308 generates the pulse width modulated signal at a first switching frequency if the slew rate of the reference current signal 802 is above the determined threshold rate. For example, during the time period $T_a$, the slew rate of the reference current signal 802 is above the determined threshold rate and thus, the pulse width modulated signal is generated at the first switching frequency. In a similar manner, the pulse width modulator 308 generates the pulse width modulated signal at a second switching frequency if the slew rate of the reference current signal 802 is below the threshold rate. For example, during the time period $T_b$, the slew rate of the reference current signal is below the threshold rate and thus, the pulse width modulated signal is generated at the second switching frequency. Thus, in the exemplary embodiment, the frequency of the pulse width modulated signal is selected based only on the slew rate information of the reference current signal.

Figure 9:
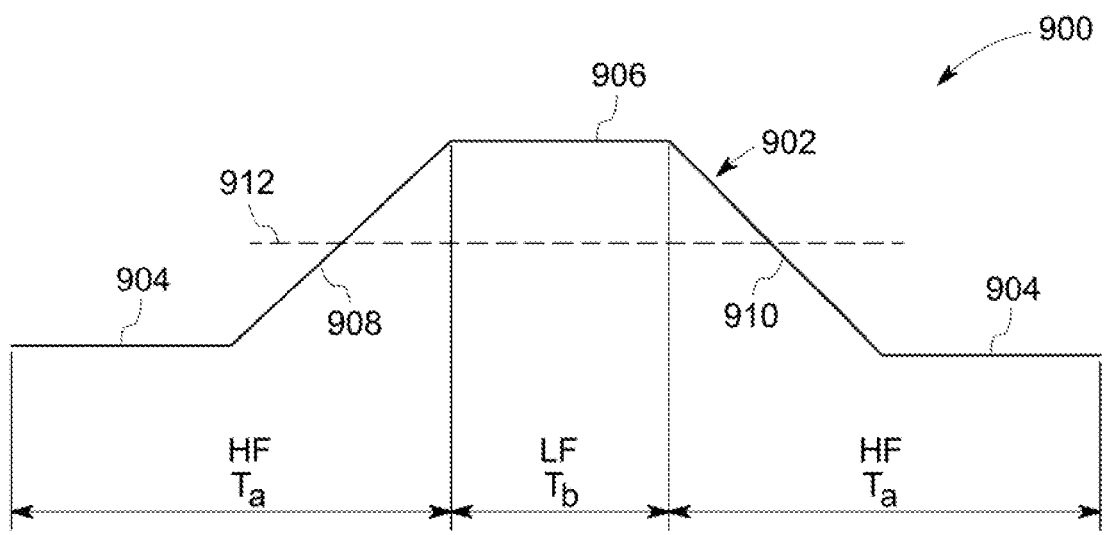
FIG. 9 is a graphical representation of a reference current signal, in accordance with other aspects of the present technique.

Referring to FIG. 9, a graphical representation 900 of a reference current signal, such as the reference current signal 312 (see FIG. 3) employed to generate a pulse width modulated signal, such as the pulse width modulated signal 318 (see FIG. 3), in accordance with another aspect of the present technique, is depicted. For ease of understanding of the present technique, FIG. 9 is described with reference to the components of FIG. 3. Plot 902 represents the reference current signal that is applied to the analyzer 306 (see FIG. 3). The reference current signal, in plot 902, shows flat bottom portions 904 and a flat top portion 906, where the slew rate is below a determined threshold rate. Similarly, the reference current signal shows a ramp-up portion 908 and a ramp-down portion 910, where the slew rate of the reference current signal is above the threshold rate. In addition, a line 912 represents a threshold amplitude level or determined level. This line 912 may be used to determine whether the magnitude or amplitude level of the reference current signal is above or below the determined level. In an embodiment, the threshold level may be a system configured threshold.

In accordance with an exemplary embodiment, the analyzer 306 determines the slew rate and the amplitude level information of the reference current signal 312 depicted by plot 902. Further, the determined slew rate and amplitude level information is communicated to the pulse width modulator 308 (see FIG. 3). The pulse width modulator 308 generates the pulse width modulated signal at a frequency based on the slew rate and amplitude level information of the reference current signal. Particularly, the pulse width modulated signal is generated at a first switching frequency, if the slew rate of the reference current signal is above the threshold rate. It may be noted that the amplitude level information is ignored if the slew rate of the reference current signal is above the threshold rate. For example, in the ramp-up and ramp-down portions 908, 910 of the reference current signal, the slew rate is above the threshold rate, and thus, the pulse width modulated signal is generated at the first switching frequency. Additionally, the pulse width modulated signal may also be generated at the first switching frequency if the slew rate of the reference current signal is below the threshold rate and the amplitude level of the reference current signal is below the determined level 912. For example, in the flat bottom portions 904 of the reference current signal, the slew rate is below the threshold rate. In addition, the amplitude level of the reference current signal in these flat bottom portions 904 is also below the determined level 912. Thus, the pulse width modulated signal is generated at the first switching frequency. Accordingly, during a time period $T_a$, the pulse width modulated signal is generated at the first switching frequency.

Furthermore, the pulse width modulated signal is generated at a second switching frequency if the slew rate of the reference current signal is below the threshold rate and the amplitude level of the reference current signal is above the determined level 912. For example, during a time period $T_b$, the slew rate of the reference current signal is below the threshold rate. Also, during this time period $T_b$, the amplitude level or magnitude of the reference current signal is above the determined level 912, and thus, the pulse width modulated signal is generated at the second switching frequency.

Figure 10:
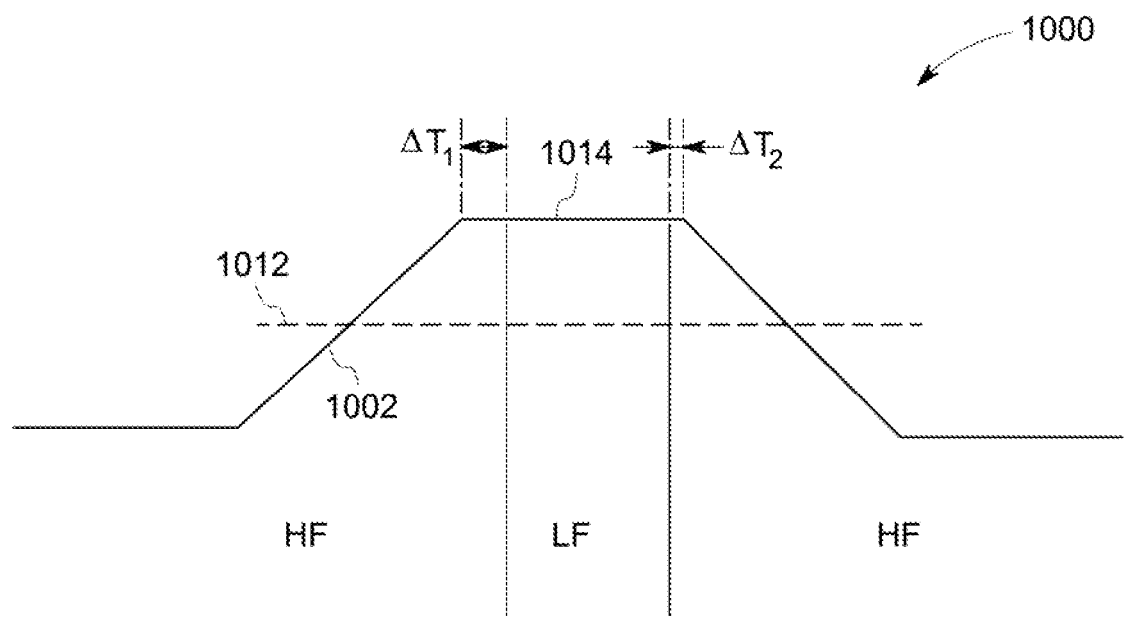
FIG. 10 is a graphical representation of a reference current signal, in accordance with yet another aspect of the present technique.

FIG. 10 is a graphical representation 1000 of a reference current signal, such as the reference current signal 312 (see FIG. 3) employed to generate a pulse width modulated signal, such as the pulse width modulated signal 318 (see FIG. 3), in accordance with yet another aspect of the present technique. Plot 1002 is substantially similar to the plot 902 of FIG. 9 and determined level 1012 is substantially similar to the determined level 912 of FIG. 9.

In an exemplary embodiment, the pulse width modulated signal is generated at the second switching frequency only if the slew rate of the reference current signal is below a threshold rate for at least a first time period $\Delta T_1$ and the amplitude level of the reference current signal is above the determined level 1012. For example, at the beginning of the first time period $\Delta T_1$ in a flat top portion 1014, the slew rate of the reference current signal is below the threshold rate and the amplitude level is above the determined level. However, the pulse width modulator 308 (see FIG. 4) determines whether the slew rate is below the threshold rate throughout the first time period $\Delta T_1$. Once the first time period $\Delta T_1$ has passed and the slew rate continues to be below the threshold rate, the pulse width modulator 308 generates the pulse width modulated signal at the second switching frequency. It may be noted that if the slew rate increases above the threshold rate within the first time period $\Delta T_1$, then the pulse width modulator 308 generates the pulse width modulated signal at the first switching frequency, and not at the second switching frequency. For example, when the slew rate falls below the threshold rate, the pulse width modulator 308 is configured to delay the generation of the pulse width modulated signal at the second switching frequency. The pulse width modulator 308 determines whether the slew rate is below the threshold rate for the time period $\Delta T_1$ to prevent unnecessary switching/changing the frequency of the pulse width modulated signal. This in turn reduces switching losses in the system.

Further, the pulse width modulated signal is generated at the first switching frequency if the pulse width modulator 308 determines that the slew rate associated with the reference current signal rises above the determined threshold rate within a second time period $\Delta T_2$. Particularly, the pulse width modulator 308 receives the slew rate and amplitude level information from the analyzer 306. Using the received slew rate and amplitude level information, the pulse width modulator 308 determines whether the slew rate of the reference current signal will increase above the threshold rate within a second time period $\Delta T_2$. This is performed to prevent any delays in changing the frequency of the pulse width modulated signal. In an embodiment, the second time period $\Delta T_2$ may be in a range from about 64 to about 128 micro seconds. If the pulse width modulator 308 determines that the slew rate may increase above the threshold rate within the second time period $\Delta T_2$, then before the second time period $\Delta T_2$ or within the second time period $\Delta T_2$, the pulse width modulator 308 switches the frequency of the pulse width modulated signal from the second switching frequency to the first switching frequency.

Figure 11:
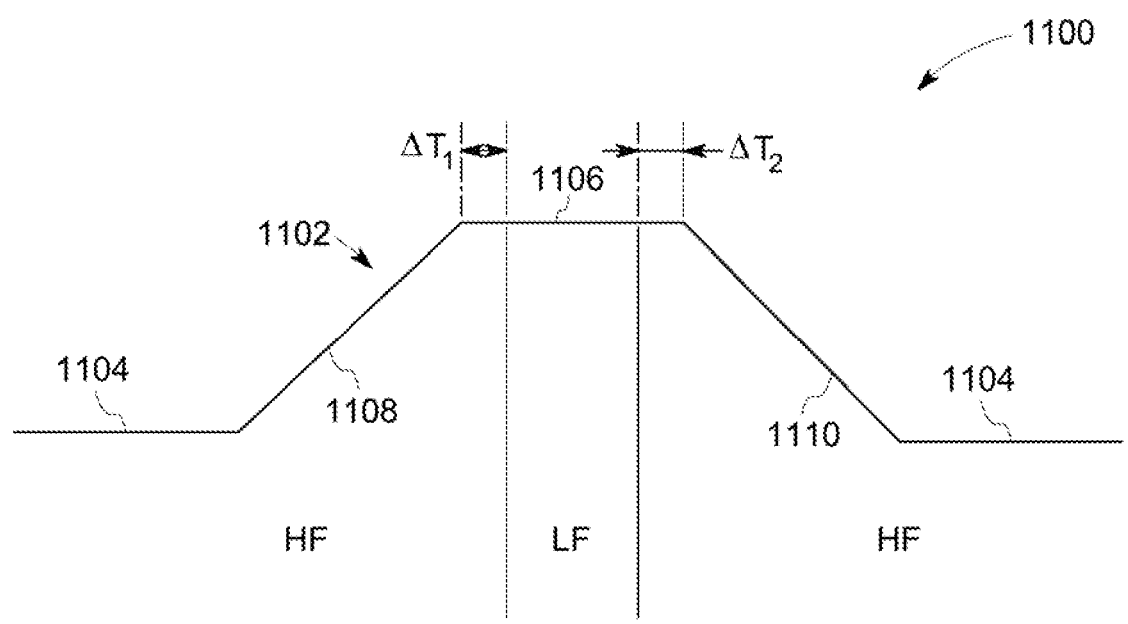
FIG. 11 is a graphical representation of a reference current signal, in accordance with other aspects of the present technique.

FIG. 11 is a graphical representation 1100 of a reference current signal, such as the reference current signal 312 (see FIG. 3) employed to generate a pulse width modulated signal, such as the pulse width modulated signal 318 (see FIG. 3), in accordance with further aspects of the present technique. Plot 1102 represents the reference current signal that is applied to the analyzer 306 (see FIG. 4). The reference current signal, in plot 1102, shows flat bottom portions 1104 and a flat top portion 1106, where a slew rate of the reference current signal is below a threshold rate. Similarly, the reference current signal shows a ramp-up portion 1108 and a ramp-down portion 1110, where the slew rate of the reference current signal is above the threshold rate.

In accordance with aspects of the present technique, the pulse width modulated signal is generated at a second switching frequency only if the slew rate of the reference current signal is below the threshold rate for at least a first time period $\Delta T_1$. Otherwise, the pulse width modulated signal is generated at the first switching frequency. For example, at the onset of the first time period $\Delta T_1$ in the flat top portion 1106, the slew rate of the reference current signal falls below the threshold rate. However, the pulse width modulator 308 (see FIG. 3) determines that the slew rate is below the threshold rate throughout the first time period $\Delta T_1$ prior to generating the pulse width modulated signal at the second switching frequency. For instance, if the slew rate increases above the threshold rate within the first time period $\Delta T_1$, then the pulse width modulator 308 continues to generate the pulse width modulated signal at the first switching frequency.

Further, the pulse width modulated signal is generated at the first switching frequency if the pulse width modulator 308 determines that the slew rate associated with the reference current signal rises above the determined threshold rate within a second time period $\Delta T_2$. Particularly, the pulse width modulator 308 receives slew rate information from the analyzer 306. Using the received slew rate information, the pulse width modulator 308 determines whether the slew rate of the reference current signal rises above the threshold rate within the second time period $\Delta T_2$. If the pulse width modulator 308 determines that the slew rate will increase above the threshold rate within the second time period $\Delta T_2$, then before the second time period $\Delta T_2$ or within the second time period $\Delta T_2$, the pulse width modulator 308 switches the frequency of the pulse width modulated signal from the second switching frequency to the first switching frequency.

Figure 12:
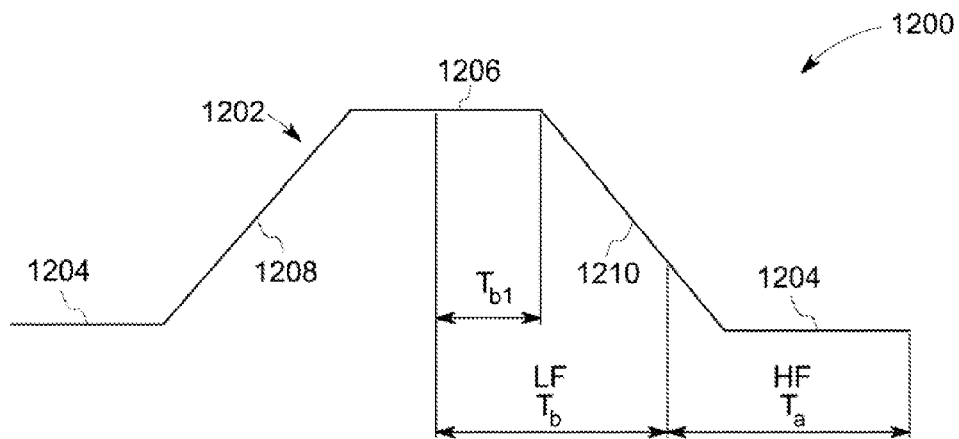
FIG. 12 is a graphical representation of a reference current signal, in accordance with yet another aspect of the present technique.

Turning now to FIG. 12, a graphical representation 1200 of a reference current signal, such as the reference current signal 312 (see FIG. 3) employed to generate a pulse width modulated signal, such as the pulse width modulated signal 318 (see FIG. 3), in accordance with another aspect of the present technique is depicted. In this embodiment, the frequency of the pulse width modulated signal is selected based on the slew rate of the reference current signal and a thermal value of a power stage, such as the power stage 104 (see FIG. 1). In an example, the thermal value may be representative of a temperature or heat associated with the power stage 104 (see FIG. 1). Plot 1202 represents the reference current signal that is applied to the analyzer 306 (see FIG. 3). The reference current signal, in plot 1202, shows flat bottom portions 1204 and a flat top portion 1206, where a slew rate of the reference current signal is below a threshold rate. Similarly, the reference current signal shows a ramp-up portion 1208 and a ramp-down portion 1210, where the slew rate of the reference current signal is above the threshold rate.

The pulse width modulator 308 receives the slew rate information from the analyzer 306. In addition, the pulse width modulator 308 receives the thermal value of the power stage 104 from the thermal sensor 132 (see FIG. 1) disposed in the power stage 104. If the thermal value of the power stage 104 is above a threshold thermal value, then the pulse width modulator 308 generates the pulse width modulated signal at the second switching frequency irrespective of the value of the slew rate. For example, at the beginning of a time period $T_b$, the pulse width modulated signal is generated at the second switching frequency as the slew rate is below the threshold rate. However, after a time period $T_{b1}$, the slew rate rises above the threshold rate however, the thermal value of the power stage 104 may be above the threshold thermal value. In such situations, to prevent overheating of the gradient amplifier, the pulse width modulator 308 continues to generate the pulse width modulated signal at the second switching frequency until the thermal value drops below the threshold thermal value. After the time period $T_b$, the thermal value drops below the threshold thermal value. Consequently, the pulse width modulator 308 switches the frequency of the pulse width modulated signal from the second switching frequency to the first switching frequency, depicted in a time period $T_a$ of FIG. 12.

Figure 13:
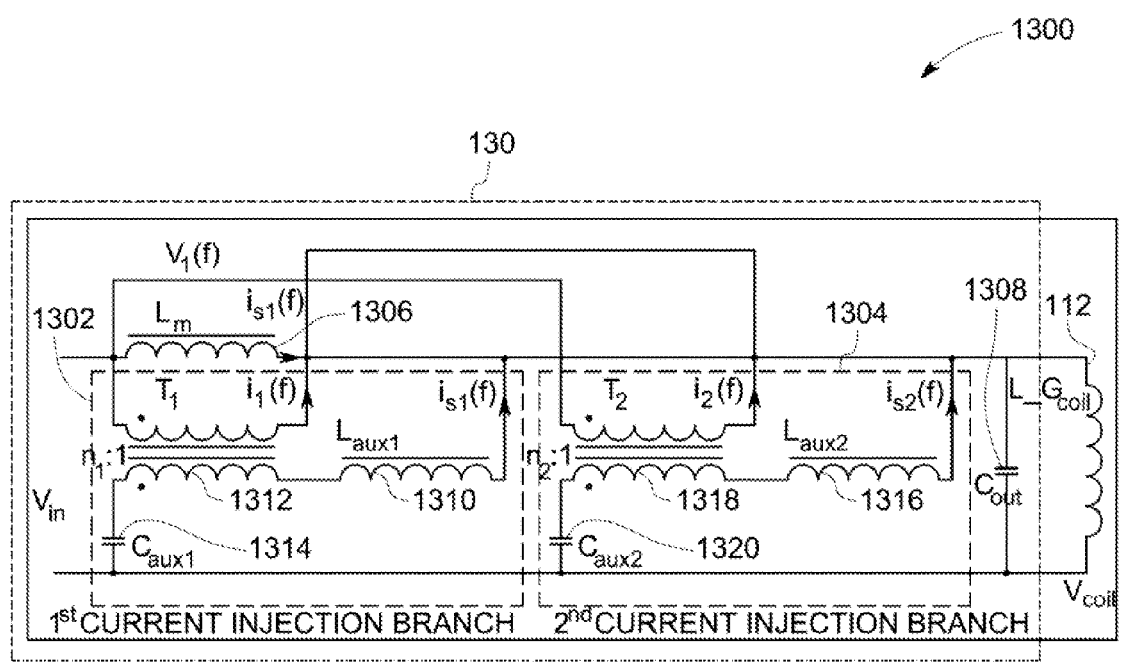
FIG. 13 is a schematic illustration of a filter unit coupled to a gradient coil, in accordance with aspects of the present technique.

Referring to FIG. 13, a circuit diagram 1300 of an exemplary filter unit, such as the filter unit 130 of FIG. 1 and a gradient coil, such as the gradient coil 112 of FIG. 1, in accordance with aspects of the present technique, is depicted. The filter unit 130 is disposed at the output terminal of the power stage 104 (see FIG. 1) to filter the coil current signal before providing the coil current signal to the gradient coil 112. More particularly, the filter unit 130 is configured to minimize a ripple current associated with the coil current signal. The term ripple current may be used to refer to an undesired high frequency current that is superposed on the coil current signal. In an exemplary embodiment, the ripple current may be at one or more frequencies. Typically, the coil current signal is at a low frequency in a range from about 0 to 1 KHz. However, the coil current signal with harmonic contents may be in a frequency range from about 0 to 20 KHZ. In a similar manner, the ripple current may be at a high frequency in a range from 125 KHz to 250 KHz.

In accordance with aspects of the present technique, the filter unit 130 may include a first current injection branch 1302, a second current injection branch 1304, a filtering inductor 1306, and a filtering capacitor 1308. It may be noted that the number of current injection branches need not be limited to two, and the filter unit may have any number of current injection branches. For example, if the coil current signal includes ripple currents at a first frequency, a second frequency, and a third frequency, then three current injection branches, such as the first current injection branch 1302, the second current injection branch 1304, and a third current injection branch (not shown in FIG. 13) are employed to minimize or cancel ripple currents from the coil current signal.

Further, the first current injection branch 1302 is configured to minimize the ripple current having a first frequency ($f_1$) that is superimposed on the coil current signal, while the second current injection branch 1304 is configured to eliminate the ripple current having a second frequency ($f_2$) that is superimposed on the coil current signal. Particularly, the first current injection branch 1302 determines whether the ripple current associated with the coil current signal is at the first frequency ($f_1$). Further, this ripple current is sampled to determine amplitude and phase of the ripple current. Subsequently, a first current signal, having the first frequency ($f_1$), is injected into the coil current signal to minimize or cancel the ripple current. More specifically, the first current signal having an amplitude substantially similar to the amplitude of the ripple current and a phase opposite to the phase of the ripple current is injected into the coil current signal to cancel the ripple current that is superimposed on the coil current signal. The phase of the first current signal is typically 180 degree out of phase of the ripple current.

In a similar manner, the second current injection branch 1304 determines whether the ripple current superimposed on the coil current signal is at the second frequency ($f_2$). Further, this ripple current is sampled to determine amplitude and phase of the ripple current. Subsequently, the second current injection branch 1304 injects a second current signal, having the second frequency ($f_2$), into the coil current signal to minimize or cancel the ripple current. More specifically, the second current signal with an amplitude substantially similar to the amplitude of the ripple current and a phase opposite to the phase of the ripple current is injected into the coil current signal to minimize or cancel the ripple current that is superimposed on the coil current signal. The phase of the second current signal is typically 180 degree out of phase of the ripple current.

In the presently contemplated configuration, the first current injection branch 1302 includes a first inductor 1310, a first transformer ($T_1$) 1312, and a first capacitor 1314. The first transformer ($T_1$) 1312 is used to sense the voltage across the filtering inductor 1306. Similarly, the second current injection branch 1304 includes a second inductor 1316, a second transformer ($T_2$) 1318, and a second capacitor 1320. The second transformer ($T_2$) 1318 is used to sense the voltage across the filtering inductor 1306.

In accordance with aspects of the present technique, the filter unit 130 receives the coil current signal from the power stage 104. The received coil current signal includes at least the coil current signal, the ripple current at the first frequency ($f_1$), and the ripple current at the second frequency ($f_2$). This received coil current signal flows through the filtering inductor 1306. Further, the first current injection branch 1302 that includes the first inductor 1310, the first transformer ($T_1$) 1312, and the first capacitor 1314, is used to generate the first current signal at the first frequency ($f_1$) to cancel the ripple current at the first frequency ($f_1$) that is superimposed on the coil current signal.

In a similar manner, the second current injection branch 1304 that includes the second inductor 1316, the second transformer ($T_2$) 1318, and the second capacitor 1320, is used to generate the second current signal at the second frequency $f_2$ to cancel the ripple current at the second frequency $f_2$ that is superimposed on the coil current signal. Further, in an embodiment, the first current injection branch 1302 and the second current injection branch 1304 are decoupled from each other. For example, the first injection branch 1302 injects only the first current signal at the first frequency $f_1$ and injects a negligible current at the second frequency $f_2$, while the second current injection branch 1304 injects only the second current signal at the second frequency $f_2$ and injects a negligible current at the first frequency $f_1$.

Furthermore, for ease of understanding of the present technique, an example where the ripple current at the first frequency $f_1$ that is superimposed on the coil current signal is considered. In this example, the voltage across inductor 1306 may be represented by equation:

$$V_1(f) = j\omega_1 \cdot L_m \cdot i_p(f_1) \tag{1}$$

Assuming that the second current injection branch 1304 injects negligible current at the first frequency $f_1$, then almost no current at the first frequency $f_1$ flows through the filtering capacitor ($C_{out}$) 1308 and the gradient coil 112. Further, by applying Kirchhoff's voltage law on the first current injection branch 1302, the following equation may be obtained:

$$\frac{1}{j\omega_1 \cdot C_{aux1}} \cdot i_{s1}(f_1) + \frac{1}{n_1} \cdot V_1(f) + j\omega_1 \cdot L_{aux1} \cdot i_{s1}(f_1) = 0 \tag{2}$$

Thereafter, the current at the primary side of first transformer $T_1$ 1312 may be represented by equation:

$$i_1(f_1) = -\frac{1}{n_1} \cdot i_{s1}(f_1) \tag{3}$$

Moreover, since the current injected by the first current injection branch 1302 is used to cancel the current at the first frequency $f_1$, the following equation may be used to represent the first current signal:

$$i_p(f_1) + i_{s1}(f_1) + i_1(f_1) = 0 \tag{4}$$

Further, equations (1), (2) and (3) are substituted into equation (4) to obtain $$\frac{\omega_1^2 \cdot L_{aux1} \cdot C_{aux1} - 1}{\omega_1^2 \cdot L_m \cdot C_{aux1}} = \frac{n_1 - 1}{n_1^2} \tag{5}$$

Concurrently, the current at the first frequency $f_1$ injected by the second current injection branch 1304 may be represented by equations (6) and (7), and these currents in equations (6) and (7) typically have a negligible value, as represented by equation (8).

$$i_{s2}(f_1) = \frac{\omega_1^2 \cdot L_m \cdot C_{aux2}}{n_2 \cdot (1 - \omega_1^2 \cdot L_{aux2} \cdot C_{aux2})} \cdot i_p(f_1) \tag{6}$$

$$i_2(f_1) = -\frac{1}{n_2} \cdot i_{s2}(f_1) \tag{7}$$

$$i_{s2}(f_1) + i_2(f_1) \approx 0 \tag{8}$$

Upon substituting equations (6) and (7) into equation (8), the following equation may be obtained:

$$\omega_1^2 \cdot L_{aux2} \cdot C_{aux2} \gg 1 \tag{9}$$

Similarly, in the case where the ripple current at the frequency $f_2$ is superimposed on the coil current signal, the following design equation may be used for the cancellation of ripple current at frequency $f_2$:

$$\frac{\omega_2^2 \cdot L_{aux2} \cdot C_{aux2} - 1}{\omega_2^2 \cdot L_m \cdot C_{aux2}} = \frac{n_2 - 1}{n_2^2} \quad (10)$$

$$\omega_2^2 \cdot L_{aux1} \cdot C_{aux1} \gg 1 \quad (11)$$

Upon minimizing or canceling the ripple current from the coil current signal, the coil current signal is provided to the gradient coil 112 through the filtering capacitor 1308. The gradient coil 112 produce a magnetic field or a gradient field proportional to the coil current signal provided to the gradient coil 112. In an embodiment, a portion of the filtered coil current signal, at the output of the filter unit 130, is provided as a feedback signal to the controller stage 102, as depicted in FIG. 1.

Figure 14:
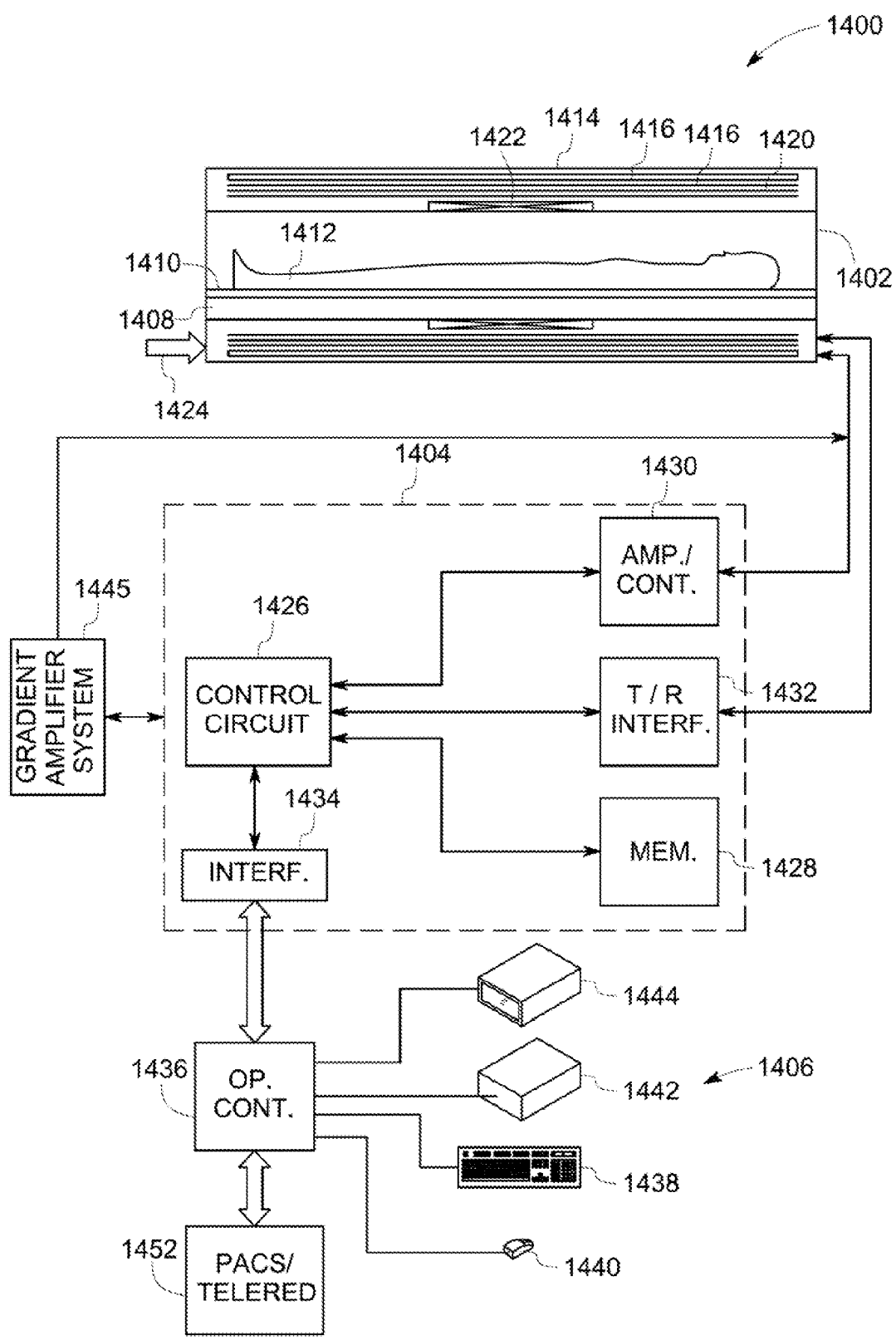
FIG. 14 is a block diagram illustrating a magnetic resonance imaging (MRI) system employing the gradient amplifier system of FIG. 1.

FIG. 14 is a block diagram 1400 illustrating an MRI system that includes the exemplary gradient amplifier system 100 (see FIG. 1), in accordance with aspects of the present technique. The MRI system 1400 is illustrated diagrammatically as including a scanner 1402, scanner control circuitry 1404, and system control circuitry 1406. While the MRI system 1400 may include any suitable MRI scanner or detector, in the illustrated embodiment the system includes a full body scanner including a patient bore 1408 into which a table 1410 may be positioned to place a patient 1412 or any suitable object in a desired position for scanning. The scanner 1402 may be of any suitable type of rating, including scanners varying from 0.5 Tesla ratings to 3 Tesla ratings and beyond.

Additionally, the scanner 1402 may include a series of associated coils for producing controlled magnetic fields, for generating radio-frequency (RF) excitation pulses, and for detecting emissions from gyromagnetic material within the patient 1412 in response to such pulses. In the diagrammatical view of FIG. 14, a primary magnet coil 1414 may be provided for generating a primary magnetic field generally aligned with the patient bore 1408. A series of gradient coils 1416, 1418, 1420 may be grouped in a coil assembly for generating controlled magnetic gradient fields during examination sequences. A radio frequency (RF) coil 1422 may be provided for generating radio frequency pulses for exciting the gyromagnetic material. In the embodiment illustrated in FIG. 14, the RF coil 1422 also serves as a receiving coil. Thus, the RF coil 1422 may be coupled with driving and receiving circuitry in passive and active modes for receiving emissions from the gyromagnetic material and for applying RF excitation pulses, respectively. Alternatively, various configurations of receiving coils may be provided separate from the RF coil 1422. Such coils may include structures specifically adapted for target anatomies, such as head coil assemblies, and so forth. Moreover, receiving coils may be provided in any suitable physical configuration, including phased array coils, and so forth.

In a presently contemplated configuration, the gradient coils 1416, 1418, 1420 may have different physical configurations adapted to their function in the MRI system 1400. The coils 1416, 1418, 1420 include conductive wires, bars or plates that are wound or cut to form a coil structure that generates a gradient field upon application of control pulses as described below. The placement of the coils 1416, 1418, 1420 within the gradient coil assembly may be done in several different orders. In an embodiment, a Z-axis coil may be positioned at an innermost location, and may be formed generally as a solenoid-like structure that has relatively little impact on the RF magnetic field. Thus, in the illustrated embodiment, the gradient coil 1420 is the Z-axis solenoid coil, while the coils 1416 and 1418 are Y-axis and X-axis coils respectively.

The coils of the scanner 1402 may be controlled by external circuitry to generate desired fields and pulses and to read signals from the gyromagnetic material in a controlled manner. It may be noted that, when the material, typically found in tissues of the patient 1412, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 1402 and processed for reconstruction of the desired image.

Furthermore, the gradient coils 1416, 1418, 1420 may be configured to facilitate generation of precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils 1416, 1418, 1420 have mutually orthogonal axes for the direction of their variation, enabling a linear field gradient to be imposed in an arbitrary direction with an appropriate combination of the three gradient coils 1416, 1418, 1420.

Moreover, the pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

Also, the slice select gradient determines a slab of tissue or anatomy to be imaged in the patient 1412. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

In addition, a great number of variations may be devised for pulse sequences employing the exemplary gradient pulse functions described hereinabove as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of the scanner 1402 are controlled by scanner control circuitry 1404 to generate the desired magnetic field and RF pulses. In the diagrammatical view of FIG. 14, the scanner control circuitry 1404 thus includes a control circuit 1426 for commanding the pulse sequences employed during the examinations, and for processing received signals. The control circuit 1426 may include any suitable programmable logic device, such as a CPU or digital signal processor of a general purpose or application-specific computer. Also, the control circuit 1426 is communicatively coupled to memory circuitry 1428, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 1426 and the coils of the scanner 1402 is managed by amplification and control circuitry 1430 and by transmission and receive interface circuitry 1432. The amplification and control circuitry 1430 includes amplifiers for each gradient field coil to supply drive current to the field coils in response to control signals from control circuit 1426. In certain embodiments, the MRI system 1400 may include an exemplary gradient amplifier system 1454 such as the gradient amplifier system 100 of FIG. 1. The gradient amplifier system 1454 may be operationally coupled to the scanner control circuitry 1404, in an embodiment. However, in certain other embodiments, the control circuitry 1404 may include the gradient amplifier system 1454.

The transmit/receive (T/R) interface circuitry 1432 includes additional amplification circuitry for driving the RF coil 1422. Moreover, where the RF coil 1422 serves both to emit the RF excitation pulses and to receive MR signals, the T/R interface circuitry 1432 may typically include a switching device for toggling the RF coil 1422 between active or transmitting mode and passive or receiving mode. A power supply, denoted generally by reference numeral 1424 in FIG. 14, is provided for energizing the primary magnet 1414. Finally, the scanner control circuitry 1404 may include interface components 1434 for exchanging configuration and image data with the system control circuitry 1406. It should be noted that, while in the present description reference is made to a horizontal cylindrical bore imaging system employing a superconducting primary field magnet assembly, the present technique may also be applied to various other configurations, such as scanners employing vertical fields generated by superconducting magnets, permanent magnets, electromagnets or combinations of these means.

The system control circuitry 1406 may include a wide range of devices for facilitating interface between an operator or radiologist and the scanner 1402 via the scanner control circuitry 1404. In the illustrated embodiment, for example, an operator controller 1436 is provided in the form of a computer workstation employing a general purpose or application-specific computer. The workstation 1436 also typically includes memory circuitry for storing examination pulse sequence descriptions, examination protocols, user and patient data, image data, both raw and processed, and so forth. Further, the workstation 1436 may further include various interface and peripheral drivers for receiving and exchanging data with local and remote devices. In the illustrated embodiment, such devices include a conventional computer keyboard 1438 and an alternative input device such as a mouse 1440. A printer 1442 may be provided for generating hard copy output of documents and images reconstructed from the acquired data. Moreover, a computer monitor 1444 may be provided for facilitating operator interface. In addition, the system 1400 may include various local and remote image access and examination control devices, represented generally by reference numeral 1452 in FIG. 14. Such devices may include picture archiving and communication systems (PACS), teleradiology systems, and the like.

The method and systems described hereinabove aid in reducing power loss in a gradient amplifier system. Also, the power loss may be evenly distributed across the bridge amplifiers as each of the bridge amplifiers in the power stage operates at substantially similar switching frequencies and DC voltages. In addition, since substantially similar DC voltage sources and bridge amplifiers are used, design cost and manufacture cost of the gradient amplifier system are substantially reduced.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A gradient amplifier system, comprising:
   a power stage comprising a plurality of bridge amplifiers, wherein each of the plurality of bridge amplifiers operates at a first switching frequency;
   a gradient coil coupled to the power stage and configured to produce a magnetic field proportional to a coil current signal supplied by the power stage;
   a controller stage coupled to an input terminal of the power stage and configured to:
     generate a pulse width modulated gate signal based on the coil current signal and a reference current signal, wherein the pulse width modulated gate signal is generated at a second switching frequency upon occurrence of a slew rate associated with the reference current signal is below a determined threshold rate for at least a first time period; and
     apply the generated pulse width modulated gate signal to the power stage for changing an operating frequency of each of the plurality of bridge amplifiers from the first switching frequency to the second switching frequency.

2. The gradient amplifier system of claim 1, wherein the controller stage is configured to generate the pulse width modulated gate signal at the first switching frequency when the slew rate associated with the reference current signal is above the determined threshold rate.

3. The gradient amplifier system of claim 1, wherein the controller stage is configured to:
   determine that the slew rate associated with the reference current signal is above the determined threshold rate within a second time period; and generate the pulse width modulated gate signal at the first switching frequency within the second time period.

4. The gradient amplifier system of claim 1, wherein the power stage comprises a thermal sensor configured to determine a thermal value of the power stage.

5. The gradient amplifier system of claim 4, wherein the controller stage is configured to generate the pulse width modulated gate signal at the second switching frequency when the thermal value associated with the power stage is above a threshold thermal value.

6. The gradient amplifier system of claim 5, wherein the controller stage is configured to generate the pulse width modulated gate signal at the first switching frequency when the slew rate associated with the reference signal is above the determined threshold rate and the thermal value associated with the power stage is below the threshold thermal value.

7. The gradient amplifier system of claim 1, wherein the controller stage is configured to generate the pulse width modulated gate signal at the first switching frequency when:
the slew rate associated with the reference current signal is below the determined threshold rate; and
an amplitude level associated with the reference current signal is below a determined level.

8. The gradient amplifier system of claim 1, wherein the controller stage is configured to generate the pulse width modulated gate signal at the second switching frequency when:
the slew rate associated with the reference current signal is below the determined threshold rate for at least the first time period; and
an amplitude level associated with the reference current signal is above a determined level.

9. The gradient amplifier system of claim 1, wherein the second switching frequency is less than the first switching frequency.

10. The gradient amplifier system of claim 1, wherein the plurality of bridge amplifiers in the power stage comprises at least a first bridge amplifier, a second bridge amplifier, and a third bridge amplifier coupled together in series.

11. The gradient amplifier system of claim 10, wherein each of the bridge amplifiers in the power stage is operationally coupled to a corresponding direct current voltage source to generate a voltage signal at an output terminal of the power stage.

12. The gradient amplifier system of claim 11, wherein the power stage is configured to generate the voltage signal by modulating a direct current voltage signal received from each of the plurality of bridge amplifiers based on the pulse width modulated gate signal applied to a corresponding bridge amplifier before providing the voltage signal to the gradient coil.

13. The gradient amplifier system of claim 12, wherein the voltage signal is modulated at a frequency that is a multiple of one of the first switching frequency and the second switching frequency and at least twice a number of bridge amplifiers in the power stage.

14. The gradient amplifier system of claim 1, further comprising a current sensor coupled to the gradient coil and configured to:
sense the coil current signal at the gradient coil; and
communicate the sensed coil current signal to the controller stage.

15. The gradient amplifier system of claim 1, wherein the controller stage comprises:

a command generator configured to generate a voltage command signal based on the coil current signal and the reference current signal;
an analyzer configured to determine the slew rate and an amplitude level associated with the reference current signal;
a thermal sensor configured to determine an thermal value of the power stage; and
a pulse width modulator coupled to the command generator and the analyzer and configured to generate the pulse width modulated gate signal by modulating the voltage command signal based on the slew rate and the amplitude level associated with the reference current signal and the thermal value of the power stage.

16. The gradient amplifier system of claim 1, further comprising a filter unit coupled between an output terminal of the power stage and the gradient coil and configured to:
minimize a ripple current associated with the coil current signal supplied by the power stage; and
communicate the coil current signal to the gradient coil after minimizing the ripple current.

17. The gradient amplifier system of claim 16, wherein the filter unit is configured to:
determine that the coil current signal is at the first switching frequency; and
inject a first current signal having the first switching frequency into the coil current signal, wherein the first current signal has an amplitude similar to an amplitude of the coil current signal and a phase opposite to a phase of the coil current signal.

18. The gradient amplifier system of claim 16, wherein the filter unit is configured to:
determine that the coil current signal is at the second switching frequency; and
inject a second current signal having the second switching frequency into the coil current signal, wherein the second current signal comprises an amplitude similar to an amplitude of the coil current signal and a phase opposite to a phase of the coil current signal.

19. A method for controlling a gradient amplifier system, the method comprising:
receiving a coil current signal from a power stage comprising a plurality of bridge amplifiers operating at a first switching frequency;
receiving a reference current signal for controlling a magnetic field across a gradient coil;
generating a pulse width modulated gate signal based on the coil current signal and the reference current signal, wherein the pulse width modulated gate signal is generated at a second switching frequency when a slew rate associated with the reference current signal is below a determined threshold rate for at least a first time period; and
applying the pulse width modulated gate signal to the power stage for changing an operating frequency of each of the plurality of bridge amplifiers from the first switching frequency to the second switching frequency.

20. The method of claim 19, wherein receiving the coil current signal comprises sensing the coil current signal at a node that couples an output terminal of the power stage to the gradient coil.

21. The method of claim 19, further comprising generating the pulse width modulated gate signal at the first switching frequency when:
the slew rate associated with the reference current signal is below the determined threshold rate; and an amplitude level associated with the reference current signal is below a determined level.

22. The method of claim 19, wherein generating the pulse width modulated gate signal at the first switching frequency further comprises:
determining that the slew rate associated with the reference current signal rises above the determined threshold rate within a second time period; and
generating the pulse width modulated gate signal at the first switching frequency within the determined second time period.

23. The method of claim 19, further comprising generating the pulse width modulated gate signal at the second switching frequency when a thermal value associated with the power stage is above a threshold thermal value.

24. The method of claim 19, further comprising generating the pulse width modulated gate signal at the first switching frequency when the slew rate associated with the reference signal is above the determined threshold rate and the thermal value associated with the power stage is below a threshold thermal value.

25. The method of claim 19, further comprising generating the pulse width modulated gate signal at the first switching frequency when the slew rate associated with the reference current signal is above the determined threshold rate.

26. The method of claim 19, further comprising generating the pulse width modulated gate signal at the second switching frequency (low frequency) when:
the slew rate associated with the reference current signal is below the determined threshold rate for at least the first time period; and
an amplitude level associated with the reference current signal is above a determined level.

27. The method of claim 19, wherein generating the pulse width modulated gate signal comprises:
identifying an error current signal by comparing the coil current signal with the reference current signal, wherein the error current signal is indicative of a deviation of the coil current signal from the reference current signal;
generating a proportional integral voltage corresponding to the error current signal;
determining at least an inductive voltage and a resistive voltage across the gradient coil; and
generating the pulse width modulated gate signal based on at least the proportional integral voltage, the inductive voltage, and the resistive voltage across the gradient coil.

28. The method of claim 27, wherein generating the pulse width modulated gate signal further comprises:
summing at least the proportional integral voltage, the inductive voltage, and the resistive voltage to generate a voltage command signal;
dividing the voltage command signal based on a number of bridge amplifiers in the power stage; and
modulating the divided voltage command signal based on a pulse width modulation scheme to generate the pulse width modulated gate signal.

29. The method of claim 19, further comprising operating each of the plurality of bridge amplifiers at the first switching frequency when at least one of:
the slew rate associated with the reference current signal is above the determined threshold rate; and
the slew rate associated with the reference current signal is below the determined threshold rate, and an amplitude level associated with the reference current signal is below a determined level.

30. The method of claim 19, further comprising operating each of the plurality of bridge amplifiers at the second switching frequency when:
the slew rate associated with the reference current signal is below the threshold rate; and
an amplitude level associated with the reference current signal is above a determined level.

31. A controller stage for controlling a gradient amplifier system, the controller stage comprising:
a command generator configured to generate a voltage command signal based on a coil current signal and a reference current signal;
an analyzer configured to determine that a slew rate associated with the reference current signal is below a determined threshold rate for at least a first time period; and
a pulse width modulator coupled to the command generator and the analyzer and configured to modulate the voltage command signal based on the slew rate associated with the reference current signal.

32. The controller stage of claim 31, further configured to modulate the voltage command signal to generate a pulse width modulated gate signal at a first switching frequency when the slew rate associated with the reference current signal is below a determined threshold rate and an amplitude level associated with the reference current signal is below a determined level.

33. The controller stage of claim 31, further configured to modulate the voltage command signal to generate a pulse width modulated gate signal at a first switching frequency when the slew rate associated with the reference current signal is above the determined threshold rate.

34. The controller stage of claim 31, further configured to modulate the voltage command signal to generate the pulse width modulated gate signal at a second switching frequency when the slew rate associated with the reference current signal is below the determined threshold rate and an amplitude level associated with the reference current signal is above a determined level.

35. The controller stage of claim 31, wherein the command generator further comprises:
a differential unit configured to:
receive the coil current signal and the reference current signal;
generate an error current signal by comparing the coil current signal with the reference current signal;
a proportional integral control unit coupled to the differential unit and configured to generate a proportional integral voltage corresponding to the error current signal;
a coil model unit configured to determine at least an inductive voltage and a resistive voltage across a gradient coil based on the reference current signal; and
a summing unit configured to generate the voltage command signal by combining at least the proportional integral voltage, the inductive voltage, and the resistive voltage.

36. The controller stage of claim 35, wherein the summing unit further comprises a dividing unit configured to divide the voltage command signal based on a number of bridge amplifiers in the gradient amplifier system.

37. A system for magnetic resonance imaging, comprising:
scanner control circuitry configured to acquire image data, wherein the scanner control circuitry comprises:

a gradient coil configured to produce magnetic fields for localizing the imaging data;

a gradient amplifier system coupled to the gradient coil and configured to supply a coil current signal to the gradient coil, wherein the gradient amplifier system comprises:

a power stage comprising a plurality of bridge amplifiers, wherein each of the plurality of bridge amplifiers operates at a first switching frequency;

a controller stage coupled to an input terminal of the power stage and configured to:

generate a pulse width modulated gate signal based on the coil current signal and a reference current signal, wherein the pulse width modulated gate signal is generated at a second switching frequency when a slew rate associated with the reference current signal is below a determined threshold rate for at least a first time period;

apply the generated pulse width modulated gate signal to the power stage for changing an operating frequency of each of the plurality of bridge amplifiers from the first switching frequency to the second switching frequency; and system control circuitry in operative association with the scanner control circuitry and configured to process the acquired image data.

\* \* \* \* \*